United States Patent
Miura

(10) Patent No.: US 7,965,144 B2
(45) Date of Patent: Jun. 21, 2011

(54) PHASE LOCKED LOOP CIRCUIT AND INTEGRATED CIRCUIT FOR THE SAME

(75) Inventor: Kiyoshi Miura, Kanagawa (JP); Michiko Miura, legal representative, Kanagawa (JP)

(73) Assignee: Sony Corporation, Tokyo (JP)

(*) Notice: Subject to any disclaimer, the term of this patent is extended or adjusted under 35 U.S.C. 154(b) by 136 days.

(21) Appl. No.: 12/382,386

(22) Filed: Mar. 16, 2009

(65) Prior Publication Data

US 2009/0243736 A1     Oct. 1, 2009

(30) Foreign Application Priority Data

Mar. 31, 2008 (JP) .................. 2008-089371

(51) Int. Cl.
*H03L 7/085* (2006.01)
*H03L 7/189* (2006.01)
(52) U.S. Cl. .............. 331/44; 331/16; 331/17; 327/157
(58) Field of Classification Search .............. 331/16, 331/17, 44; 327/157
See application file for complete search history.

(56) References Cited

U.S. PATENT DOCUMENTS

| 7,193,479 B2 * | 3/2007 | Fujita ............... 331/16 |
| 7,352,249 B2 | 4/2008 | Balboni et al. |
| 2009/0072911 A1 * | 3/2009 | Ke et al. ............ 331/16 |

FOREIGN PATENT DOCUMENTS

| JP | 10-154934 A | 6/1998 |
| JP | 2842847 | 10/1998 |
| JP | 11-308101 | 11/1999 |
| JP | 2001-156629 | 6/2001 |
| JP | 2005-311945 A | 11/2005 |
| JP | 2007-507985 T | 3/2007 |
| JP | 2008-028765 A | 2/2008 |
| JP | 2008-072166 A | 3/2008 |

OTHER PUBLICATIONS

Japanese Office Action issued Apr. 27, 2010 for corresponding Japanese Application No. 2008-089371.

Maxim, Adrian, et al, "A Fully Integrated 0.13-μm CMOS Digital Low-IF DBS Satellite Tuner Using a Ring Oscillator-Based Frequency Synthesizer" IEEE Journal of Solid-State Circuits, vol. 42, No. 5. May 2007, pp. 967-982.

* cited by examiner

*Primary Examiner* — Robert Pascal
*Assistant Examiner* — James E Goodley
(74) *Attorney, Agent, or Firm* — Rader, Fishman & Grauer PLLC

(57) ABSTRACT

The present invention provides a phase locked loop circuit including: a voltage controlled oscillator; a variable frequency-dividing circuit; a phase comparing circuit for comparing a phase of the frequency-dividing signal a charge pump circuit; a loop filter; a voltage supplying circuit; a frequency measuring circuit; and a voltage measuring circuit.

5 Claims, 12 Drawing Sheets

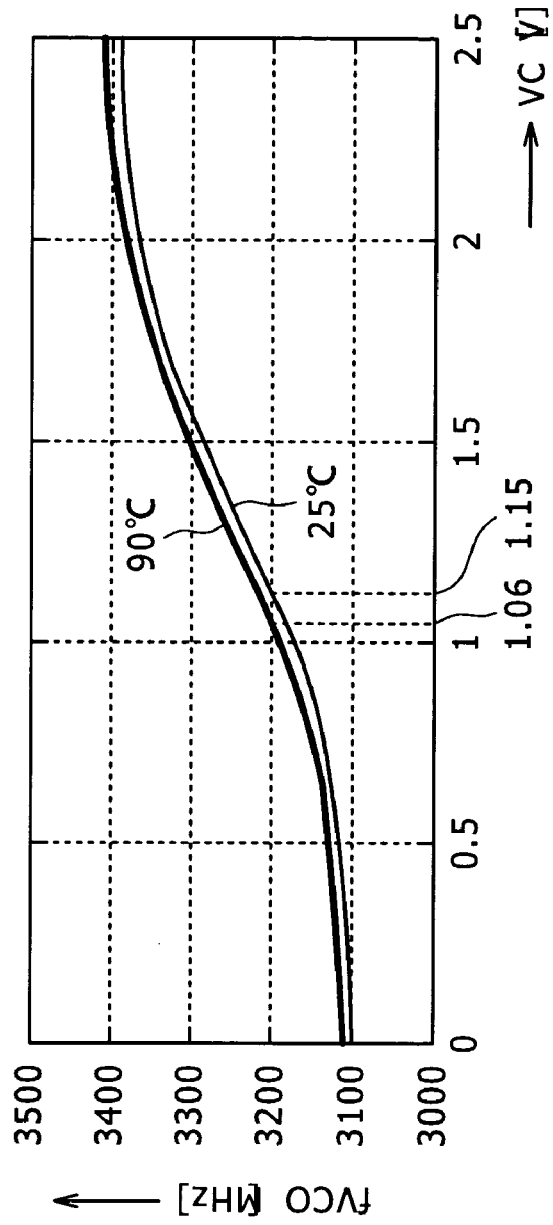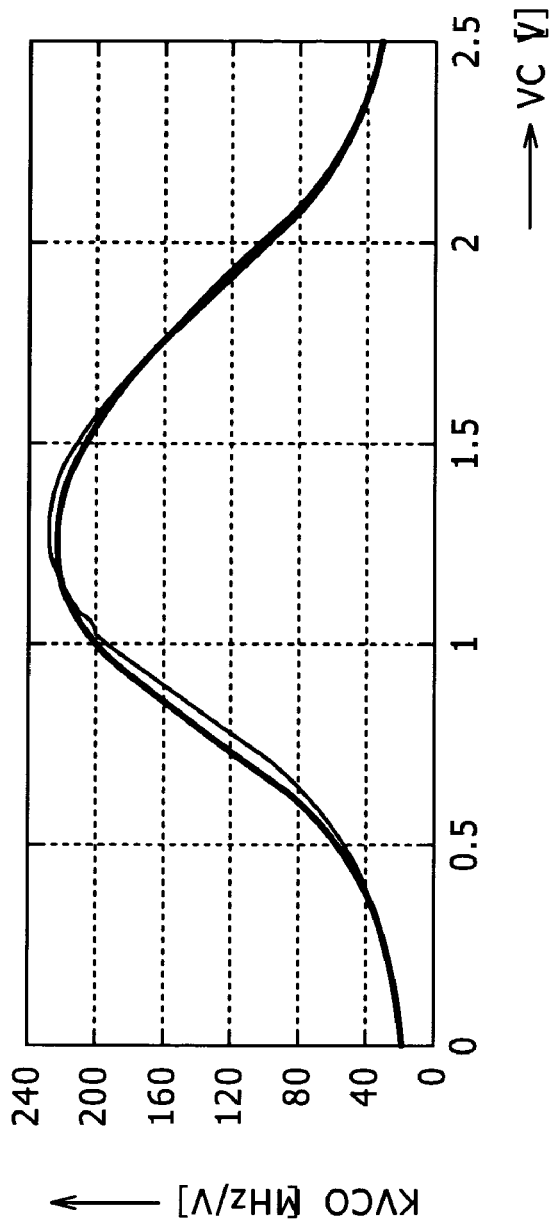
FIG. 4A
FIG. 4B

PHASE LOCKED LOOP CIRCUIT AND INTEGRATED CIRCUIT FOR THE SAME

BACKGROUND OF THE INVENTION

1. Field of the Invention

The present invention relates to a PLL (Phase Locked Loop) circuit which is suitable for being used in a receiver using a synthesizer system, and an IC (Integrated Circuit) for the same.

2. Description of the Related Art

When a receiver using a super-heterodyne system is configured so as to use a synthesizer system instead, in general, a local oscillation signal is outputted from a PLL circuit. FIG. 11 shows an example of such a PLL circuit 30. In the PLL circuit 30, an oscillation signal SVCO from a VCO (Voltage Controlled Oscillator) 31 is supplied to a variable frequency-dividing circuit 32. The variable frequency-dividing circuit 32 frequency-divides the oscillation signal SVCO having an oscillation frequency into a frequency-dividing signal having a frequency of 1/N (N: positive integral number) of the oscillation frequency of the oscillation signal SVCO. The resulting frequency-dividing signal is then supplied to a phase comparing circuit 33. In addition, an alternating current (A.C.) signal SREF having a reference frequency fREF is supplied to the phase comparing circuit 33.

Also, a comparison output signal from the phase comparing circuit 33 is supplied to a loop filter 35 through a charge pump circuit 34. A direct current (D.C.) voltage VC having a level which changes so as to correspond to a phase difference between the frequency of the output signal from the variable frequency-dividing circuit 32, and the reference frequency fREF is fetched from the loop filter 35. Also, the D.C. voltage VC thus fetched is supplied as a control voltage for an oscillation frequency fVCO to the VCO 31.

Therefore, in a stationary state, the oscillation frequency fVCO of the VCO 31 is given by Expression (1):

$$fVCO = N \cdot fREF \qquad (1)$$

where N is a frequency driving ratio. Thus, the changing of the frequency-dividing ratio N makes it possible to change the oscillation frequency fVCO of the VCO 31. As a result, the oscillation signal SVCO of the VCO 31 (or a frequency-dividing signal thereof) is used as a local oscillation signal, thereby converting a frequency of a received signal. Also, the changing of the frequency-dividing ratio N makes it possible to change the frequency of the received signal. That is to say, it is possible to carry out the signal reception using the synthesizer system.

Now, in the PLL circuit 30, in the case of the same setting, the loop characteristics when the oscillation frequency fVCO is the highest frequency, and the loop characteristics when the oscillation frequency fVCO is the lowest frequency largely change from each other. Also, when the loop characteristics change, not only the stability of a feedback loop itself changes, but also a phase noise changes.

The change in phase noise results in that although the oscillation frequency fVCO of the VCO 31 should be ideally held constant, i.e., held at a value of the oscillation frequency fVCO as indicated by a heavy line in FIG. 12, the oscillation frequency fVCO of the VCO 31 changes as indicated by a thin line. Also, the phase noise is an important item in a phase of reception of a digital broadcasting, and thus exerts an influence on the reception of a broadcasting wave signal. Therefore, it is necessary to prevent the loop characteristics from changing even when the oscillation frequency fVCO changes.

On the other hand, the loop characteristics of the PLL circuit 30 depends on a transfer function G(s) when the PLL circuit 30 is held in a state of an open loop. That is to say, in FIG. 12, a signal line extending from the variable frequency-dividing circuit 32 to the phase comparing circuit 33 is cut at a point X, thereby holding the PLL circuit 30 in the open loop state. In this state, the transfer function G(s) about a signal line extending from an input terminal of the phase comparing circuit 33 (an input terminal of the reference signal SREF) to an output terminal of the variable frequency-dividing circuit 32 (an output terminal of the frequency-dividing signal) is given by Expression (2):

$$G(s) = (ICP/2\pi) \cdot (ZP(s) \cdot KVCO)/SN \qquad (2)$$

where ICP (Inductively Coupled Plasma) is a charge pump current of the charge pump circuit 34, ZP(s) is an impedance of the loop filter 35, KVCO is a control sensitivity of the VCO 31 and is given by $KVCO = \Delta fVCO/\Delta VC$, and N is a frequency-dividing ratio of the frequency-dividing circuit 32.

Therefore, when the frequency-dividing ratio N is changed for the purpose of changing the oscillation frequency fVCO, the transfer function G(s) changes accordingly. As a result, the stability and the phase noise of the PLL circuit 30 change accordingly. In addition thereto, when in a television receiver, a front end circuit is configured in the form of an IC, and the response can be made to television broadcastings of the countries by using one IC, a variability region of the oscillation frequency fVCO of the PLL circuit configured in the form of an on-chip becomes considerably wide, and the variability region of the frequency-dividing ratio N becomes considerably wide. For this reason, the stability and the phase noise of the PLL circuit 30 becomes easy to get worse.

In order to cope with this situation, it is devised as a first compensation method that reference is made to the frequency-dividing ratio N, and the charge pump current ICP of the charge pump circuit 34 is changed in proportion to the frequency-dividing ratio N thus referred, thereby suppressing the change in transfer function G(s) in Expression (2). This technique, for example, is described in Japanese Patent No. 2,842,847 and Japanese Patent Laid-Open No. 2001-156629.

In addition, a method in which since the oscillation frequency fVCO of the VCO 31 depends on an output voltage VC of the loop filter 35, that is, a control voltage VC for the VCO 31, the control voltage VC is monitored, and the charge pump current ICP is controlled in accordance with the control voltage VC is also devises as a second compensation method. This technique, for example, is described in Japanese Patent Laid-Open No. Hei 11-308101.

Moreover, the following method is also devised as a third compensation method. That is to say, in a phase of calculation of the charge pump current ICP, the PLL circuit 30 is held in the open loop state once. Also, the oscillation frequency fVCO of the VCO 31 for the control voltage VC is measured with a frequency counter, thereby actually measuring the control sensitivity KVCO. Also, the charge pump current ICP is obtained based on the control sensitivity KVCO obtained from the actual measurement result. This technique, for example, is described in non-patent literary document of "A Fully Integrated 0.13-µm CMOS Digital Low-IF DBS Satellite Tuner Using a Ring Oscillator-Based Frequency Synthesizer," IEEE JSSC, pp. 967 to 982, Vol. 42, No. 5, MAY 2007.

According to the first to third compensation methods, the charge pump current ICP is changed so as to correspond to either the frequency-dividing ratio N or the oscillation frequency fVCO in Expression (2). Therefore, the transfer function G(s) can be stabilized. As a result, the loop characteristics of the PLL circuit 30 can be stabilized.

SUMMARY OF THE INVENTION

According to the first to third compensation methods described above, the charge pump current ICP is changed so as to correspond to either the frequency-dividing ratio N or the oscillation frequency fVCO in Expression (2). Therefore, the transfer function G(s) ought to be stabilized. As a result, the loop characteristics of the PLL circuit 30 ought to be stabilized.

However, in the first and second compensation methods described above, as apparent from Expression (2) as well, attention is paid only to the frequency-dividing ratio N, that is, only to the oscillation frequency fVCO of the VCO 31, and the charge pump current ICP of the factors with which the loop characteristics of the PLL circuit 30 are determined. In this case, the control sensitivity KVCO of the VCO 31, and the impedance ZP of the loop filter 35 as other factors with which the loop characteristics are determined are assumed to be constant.

For this reason, actually, the loop characteristics of the PLL circuit 30 changes due to the dispersion, the temperature change, the temporal change, and the like of the characteristics of the constituent elements of the VCO 31 and the loop filter 35.

In addition, when the VCO 31 is configured in the form of on-chip in the IC as in the recent case, a variable-capacitance diode (a so-called varicap) of the VCO 31 is also desired to be configured in the form of an IC. Also, in the front end circuit for receiving the television broadcasting, or the like, a PN (Positive-Negative) junction type variable-capacitance diode having a narrow control range for a capacitance (electrostatic capacitance) is not used as the variable-capacitance diode, but a MOS (Metal Oxide Semiconductor) type variable-capacitance diode having a wide control range for a capacitance is used as the variable-capacitance diode in many cases.

However, since the MOS type variable-capacitance diode has a non-linear relationship between a control voltage and a capacitance, the control sensitivity KVCO largely changes depending on the control voltage. In particular, when the control voltage is used in the wide range, the non-linearity of the MOS type variable-capacitance diode exerts a large influence on the loop characteristics. That is to say, in such a case, with the existing control method, the loop characteristics can no longer be held constant.

In addition, a method of adopting a configuration of a capacitor bank is effective when the necessary oscillation frequency range cannot be covered even by using the MOS type variable-capacitance diode in the case where the VCO 31 is configured in the form of the on-chip in the IC. This method is described as follows. That is to say, for example, as shown in FIG. 13, series circuits of a capacitor C0 and a switch circuit S0, . . . , and a capacitor Cn and a switch circuit Sn are connected in parallel with an original variable-capacitance diode CD, thereby obtaining a total capacitance C. Also, the switch circuits S0 to Sn are selectively controlled to be turned ON/OFF, thereby changing the total capacitance C, and the capacitance of the variable-capacitance diode CD is changed, thereby changing the oscillation frequency fVCO.

In this case, since the capacitances of the capacitors C0 to Cn have no relation to the control voltage VC of the variable-capacitance diode CD, the control sensitivity KVCO differs depending on the combinations of the capacitors C0 to Cn. As a result, it becomes more difficult to hold the loop characteristics constant without taking the control sensitivity KVCO into consideration. In addition, even when the control voltage VC for the VCO 31 (the control voltage for the variable-capacitance diode CD) is monitored, the oscillation frequency fVCO cannot be detected. Thus, even if the control sensitivity KVCO is constant, the charge pump current ICP cannot be controlled only with the control voltage VC.

In that respect, in the case of the third compensation method, the charge pump current ICP can be suitably set because the charge pump current ICP is set based on the actual measurement of the control sensitivity KVCO. However, in the case as well of the third compensation method, it is impossible to cope with the change, in control sensitivity KVCO of the VCO 31, caused by the ambient temperature. In addition, when the control sensitivity KVCO is measured, the PLL circuit 30 needs to be held in the open loop state once. At this time, since the PLL circuit 30 cannot be used, it is not allowed to use the third compensation method in the front end circuit or the receiver which continuously receives the broadcasting.

In the light of the foregoing, it is therefore desirable to provide a PLL circuit desired characteristics of which can be held even when a control sensitivity of a VCO disperses due to a manufacture process, and an IC for the same.

In order to attain the desire described above, according to an embodiment of the present invention, there is provided a PLL circuit including: a VCO; a variable frequency-dividing circuit for frequency-dividing an oscillation signal having an oscillation frequency of the VCO into a frequency-dividing signal having a frequency of (1/N) (N: positive integral number) of the oscillation frequency of the oscillation signal; a phase comparing circuit for comparing a phase of the frequency-dividing signal outputted from the variable frequency-dividing circuit, and a phase of a signal having a reference frequency with each other; a charge pump circuit to which a comparison output signal is supplied from the phase comparing circuit; and a loop filter for fetching a D.C. component from an output signal from the charge pump circuit, supplying the D.C. component thus fetched as a control signal for the oscillation frequency of the VCO to the VCO; a voltage supplying circuit for, in a phase of measurement, supplying a predetermined first control voltage as a control signal for the oscillation frequency of the VCO to the VCO instead of the output signal from the charge pump circuit; a frequency measuring circuit for, in the phase of the measurement, measuring the oscillation frequency of the VCO; and a voltage measuring circuit for, in a phase of use, measuring a magnitude of a second control voltage supplied as a control signal for the oscillation frequency of the VCO to the VCO; in which in the phase of the measurement, a data table representing a relationship between the first control voltage, and a rate of a change in oscillation frequency of the VCO is created by the voltage supplying circuit and the frequency measuring circuit; in the phase of the use, the second control voltage measured by the voltage measuring circuit is converted into a control sensitivity representing the rate of the change in oscillation frequency by referring to the data table; and a magnitude of a charge pump current of the charge pump circuit is controlled by using the control sensitivity as a result of the conversion so that a transfer function in a phase of an open loop becomes constant irrespective of the frequency-dividing ratio N.

According to another embodiment of the present invention, there is provided an IC for a PLL circuit including: a VCO; a variable frequency-dividing circuit for frequency-dividing an oscillation signal having an oscillation frequency of the VCO into a frequency-dividing signal having a frequency of (1/N) (N: positive integral number) of the oscillation frequency of the oscillation signal; a phase comparing circuit for comparing a phase of the frequency-dividing signal outputted from the variable frequency-dividing circuit, and a phase of a signal having a reference frequency with each other; a charge pump circuit to which a comparison output signal is supplied from the phase comparing circuit; and a loop filter for fetching a D.C. component from an output signal from the charge pump circuit, and supplying the D.C. component thus fetched as a control signal for the oscillation frequency of the VCO to the VCO; in which a voltage supplying circuit for, in a phase of measurement, supplying a predetermined first control voltage as a control signal for the oscillation frequency of the VCO to the VCO instead of the output signal from the charge pump circuit, a frequency measuring circuit for, in the phase of the measurement, measuring the oscillation frequency of the VCO, and a voltage measuring circuit for, in a phase of use, measuring a magnitude of a second control voltage supplied as a control signal for the oscillation frequency of the VCO to the VCO are formed as one-chip IC; in the phase of the measurement, a data table representing a relationship between the first control voltage, and a rate of a change in oscillation frequency of the VCO is created by the voltage supplying circuit and the frequency measuring circuit; in the phase of the use, the second control voltage measured by the voltage measuring circuit is converted into a control sensitivity representing the rate of the change in oscillation frequency by referring to the data table; and a magnitude of a charge pump current of the charge pump circuit is controlled by using the control sensitivity as a result of the conversion so that a transfer function in a phase of an open loop becomes constant irrespective of the frequency-dividing ratio N.

According to the embodiments of the present invention, even when the control sensitivity of the VCO disperses due to the manufacture process, the desired PLL characteristics can be held. Also, at this time, the trimming or the like needs not to be carried out. In addition, even when the ambient temperature changes, the loop characteristics of the PLL circuit can be controlled so as to be held at the defined value without stopping the operation of the PLL circuit.

Moreover, even when the measured voltage or the like is not applied from the outside to the PLL circuit operating in the stationary state, the oscillation frequency, control sensitivity or the like of the VCO can be measured.

BRIEF DESCRIPTION OF THE DRAWINGS

FIGS. 4A and 4B are respectively graphs showing examples of measurement of characteristics of a VCO;

DETAILED DESCRIPTION OF THE PREFERRED EMBODIMENTS

[1] Example of Circuit of Television Receiver

Firstly, a description will be given with respect to an example of a television receiver to which the present invention can be applied. With the television receiver in this example, television broadcastings of countries can be received irrespective of their broadcasting forms. The television receiver is composed of a front end circuit, and a baseband circuit.

Also, with the front end circuit, in this example, the frequencies which are used in the television broadcastings of the respective countries are divided into the following three bands:
(A) 46 to 147 MHz (VL band)
(B) 147 to 401 MHz (VH band)
(C) 401 to 887 MHz (U band)

Thus, in each of the reception bands (A) to (C), the frequency can be changed so as to correspond to the desired channel.

[1-1] Example of Front End Circuit

Figure 1:
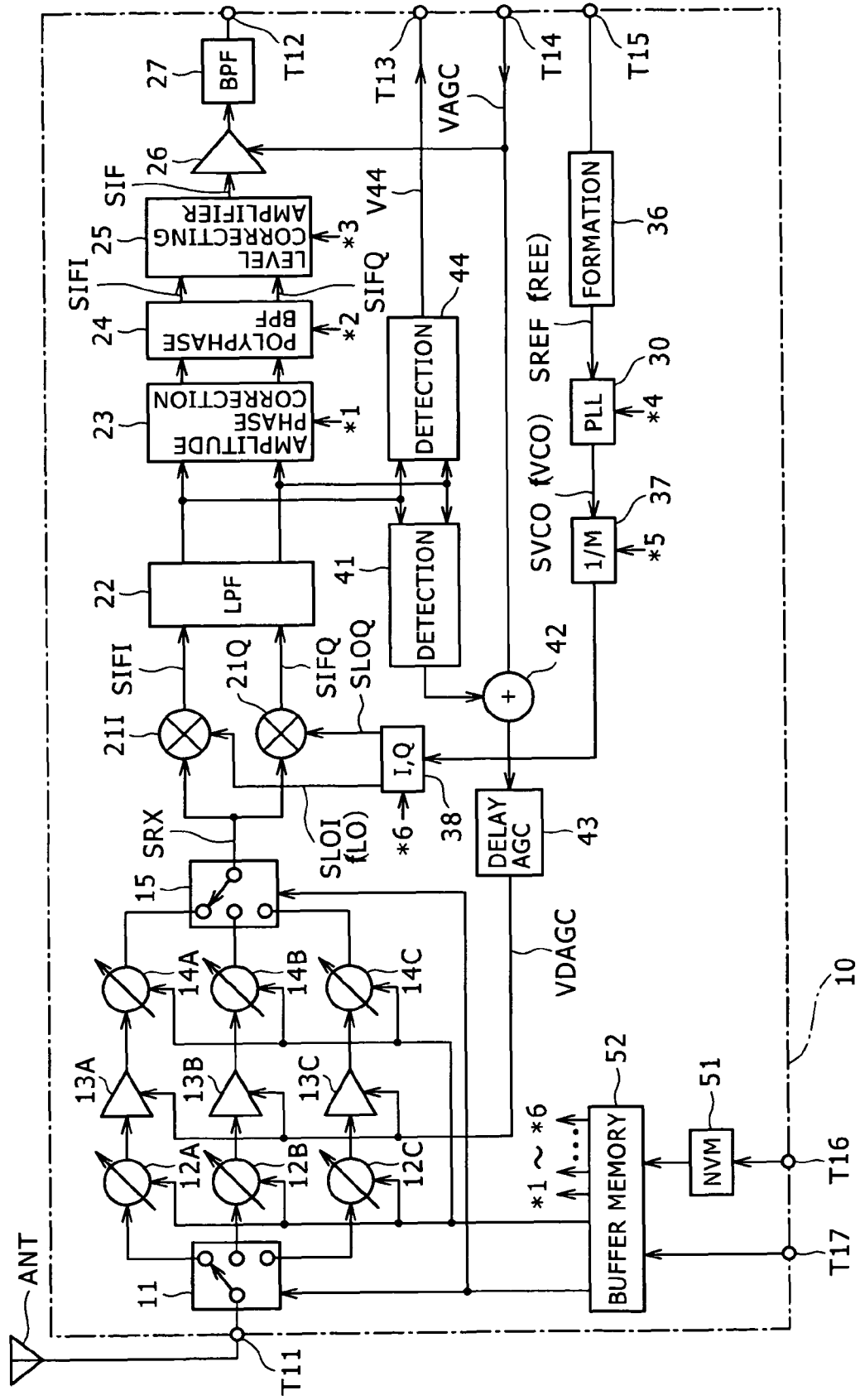
FIG. 1 is a block diagram showing an example of a front end circuit to which the present invention can be applied.

Referring now to FIG. 1, a portion 10 surrounded by a chain line shows a front end circuit. In this case, the front end circuit 10 is configured in the form of one-chip IC. In addition, the front end circuit (IC) 10 has terminal pins T11 to T18 for external connection.

Also, a broadcasting wave signal of a television broadcasting is received at an antenna ANT, and the received signal is selectively supplied to antenna tuning circuits 12A to 12C through from the terminal pin T11 to a switch circuit 11. In this case, the antenna tuning circuits 12A to 12C are provided so as to correspond to the reception bands shown in the items (A) to (C) described above, respectively. In this case, the antenna tuning circuits 12A to 12C are configured in such a way that a plurality of tuning capacitors are selectively connected in accordance with digital data, thereby changing the tuning frequency so as to be tuned with a reception signal having the desired frequency (channel).

Also, the received signals outputted from the tuning circuits 12A to 12C, respectively, are supplied to a switch circuit 15 through high frequency amplifiers 13A to 13C, and interstage tuning circuits 14A to 14C, respectively. In this case, the interstage tuning circuits 14A to 14C are also configured similarly to the tuning circuits 12A to 12C. However, the tuning capacitors of the interstage tuning circuits 12A to 12C, and 14A to 14C, and the tuning circuits 12A to 12C are built in the IC 10, and also the IC 10 includes external tuning coils thereof. Moreover, the switch circuit 15 is switched in conjunction with the switch circuit 11. Therefore, a received signal SRX having the desired reception band is fetched from the switch circuit 15. Also, the received signal SRX thus fetched is supplied to each of mixer circuits 21I and 21Q.

In addition, a clock signal having a stable frequency (in the range of about 1 to about 2 MHz) is supplied from the outside to a signal forming circuit 36 through the terminal pin T15, thereby forming a signal SREF having a reference frequency fREF. The resulting signal SREF is supplied as a reference signal to a PLL circuit 30.

Figure 3:
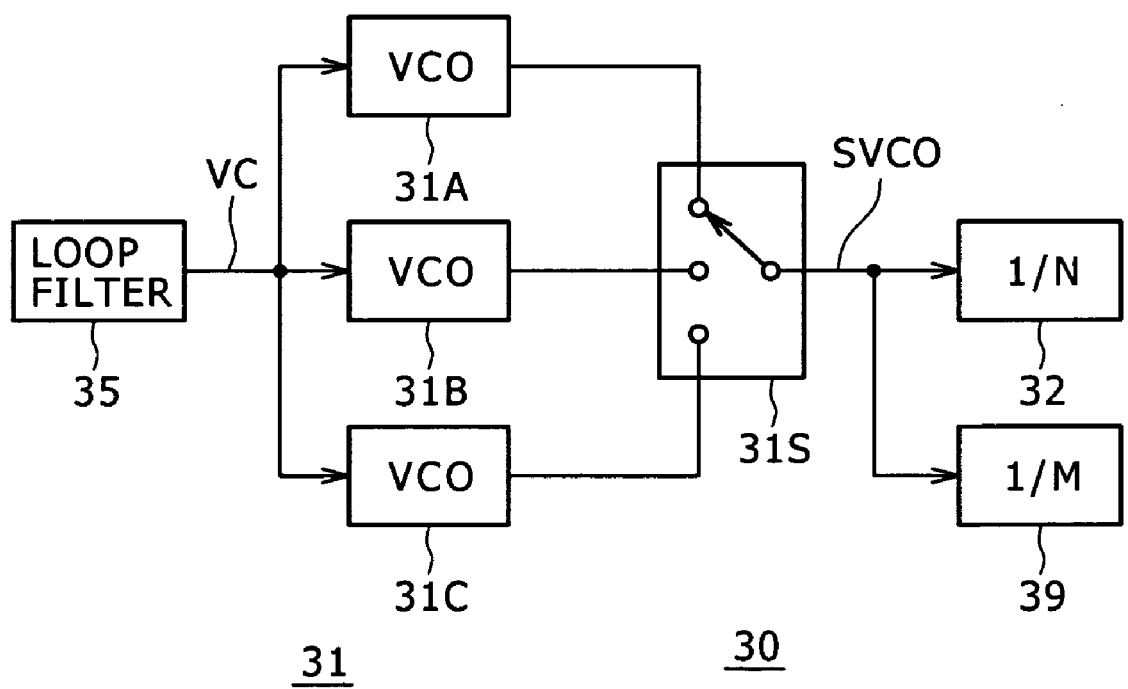
FIG. 3 is a system diagram explaining a part of the front end circuit shown in FIG. 1.
Figure 11:
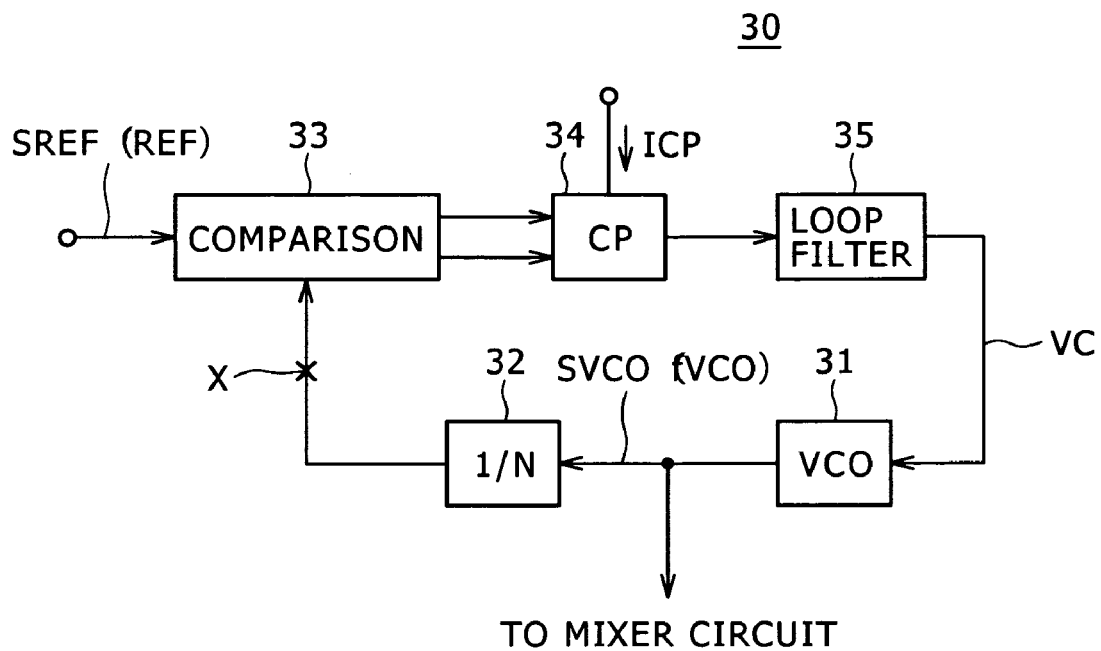
FIG. 11 is a block diagram explaining an existing PLL circuit.
Figure 12:
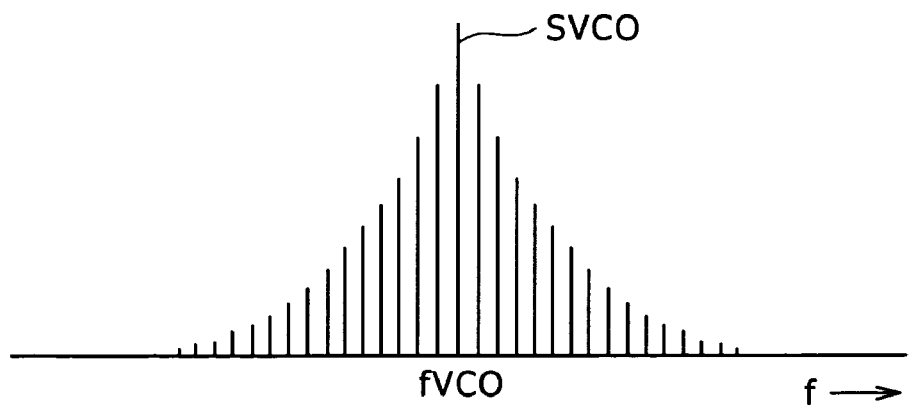
FIG. 12 is a frequency spectrum diagram explaining characteristics of the existing PLL circuit.

Although details of the PLL circuit 30 will be described later, the PLL circuit operates in a stationary phase in the manner as described with reference to FIG. 11. In addition, in order to correspond to the reception frequency in the broad range shown in the items (A) to (C) described above, the VCO 31 and a peripheral circuit thereof, for example, are configured as shown in FIG. 3.

That is to say, VCOs 31A to 31C having oscillation frequency bands different from one another are provided as the VCO 31, and an output voltage VC from a loop filter 35 is supplied as a control signal for each of oscillation frequencies of the VCOs 31A to 31C to each of the VCOs 31A to 31C. Also, oscillation signals of the VCOs 31A to 31C are selectively fetched so as to correspond to the reception frequency by a switch circuit 31S. The oscillation signal thus fetched is supplied as an oscillation signal SVCO of the VCO 31 to a variable frequency-dividing circuit 32.

Therefore, the VCOs 31A to 31C become selectively valid by the switch circuit 31S, which results in that an apparent oscillation frequency band for the VCO 31 is widened, thereby making it possible to correspond to the reception frequencies shown in the items (A) to (C) described above.

It is noted that in the following description, the VCOs 31A to 31C, and the switch circuit 31S are representatively represented by the VCO 31 for brief unless they are especially given notice.

Also, in this case, as described above, the oscillation frequency fVCO of the VCO 31 is expressed by Expression (1). Therefore, when the frequency-dividing ratio N is controlled by a microcomputer (not shown) for system control, the oscillation frequency fVCO of the VCO 31 can be changed. For example, the oscillation frequency fVCO of the VCO 31 is set in the range of 1.8 to 3.6 GHz in correspondence to the reception band and the reception frequency (reception channel).

Then, the oscillation signal SVCO, having an oscillation frequency, fetched from the switch circuit 31S is supplied to the variable frequency-dividing circuit 37 to be frequency-divided into a frequency-dividing signal having a frequency of 1/M (for example, M=2, 4, 8, 16, 32) of the oscillation frequency. The resulting frequency-dividing signal is supplied to a frequency-dividing circuit 38 to be frequency-divided into frequency-dividing signals SL0I and SL0Q having phases mutually orthogonal. Also, the resulting frequency-dividing signals SL0I and SL0Q are supplied as local oscillation signals to mixer circuits 21I and 21Q, respectively.

Here, when the frequency of each of the local oscillation signals SL0I and SL0Q is represented by fL0, the frequency fL0 is given by Expression (3):

$$fL0 = fVCO/(2M) \quad (3)$$
$$= N \cdot fREF/(2M)$$
$$= fREF \cdot N/(2M)$$

Therefore, the changing of the frequency-dividing ratios M and N makes it possible to change the local oscillation frequency fL0 over a wide range in a predetermined frequency step. For example, the local oscillation frequency fL0 is set in the range of 28.125 to 900 MHz so as to correspond to the items (A) to (C) described above.

In addition, a received signal SRX desired to be received is given in brief by Expression (4):

$$SRX = ERX \cdot \sin \omega RXt \quad (4)$$

where ERX is an amplitude of the received signal, and ωRX is given by 2πfRX where fRX is a central frequency of the received signal SRX.

Also, an image disturbing signal SUD is given in brief by Expression (5):

$$SUD = EUD \cdot \sin \omega UDt \quad (5)$$

where EUD is an amplitude of the image disturbing signal SUD, and ωUD is given by 2πfUD where fUD is a central frequency of the image disturbing signal SUD.

Moreover, the local oscillation signals SL0I and SL0Q are given by Expression (6):

$$SL0I = EL0 \cdot \sin \omega L0t$$
$$SL0Q = EL0 \cdot \cos \omega L0t \quad (6)$$

where EL0 is an amplitude of each of the local oscillation signals SL0I and SL0Q, and ωL0 is given by 2πfL0.

However, at this time, when ωIF=2πfIF where fIF is an intermediate frequency which, for example, is set in the range of 4 to 5.5 MHz (which is changed depending on the broadcasting systems) is established, in the case of an upper heterodyne system, the central frequency fRX of the received signal SRX, and the central frequency fUD of the image disturbing signal SUD are given by Expression (7):

$$fRX = fL0 - fIF$$
$$fUD = fL0 + fIF \quad (7)$$

Therefore, signals SIFI and SIFQ outputted and fetched from the mixer circuits 21I and 21Q are respectively expressed by Expressions (8) and (9):

$$\begin{aligned} SIFI &= (SRX + SUD) \times SL0I \\ &= ERX \cdot \sin\omega RXt \times EL0 \cdot \sin\omega L0t + \\ &\quad EUD \cdot \sin\omega UDt \times EL0 \cdot \sin\omega L0t \\ &= \alpha\{\cos(\omega RX - \omega L0)t - \cos((\omega RX + \omega L0)t\} + \\ &\quad \beta\{\cos(\omega UD - \omega L0)t - \cos(\omega UD + \omega L0)t\} \end{aligned} \quad (8)$$

where $\alpha = ERX \cdot EL0/2$, and $\beta = EUD \cdot EL0/2$.

$$\begin{aligned} SIFQ &= (SRX + SUD) \times SL0Q \\ &= ERX \cdot \sin\omega RXt \times EL0 \cdot \cos\omega L0t + \\ &\quad EUD \cdot \sin\omega UDt \times EL0 \cdot \cos\omega L0t \\ &= \alpha\{\sin(\omega RX + \omega L0)t + \sin(\omega RX - \omega L0)t\} + \\ &\quad \beta\{\sin(\omega UD + \omega L0)t + \sin((\omega UD - \omega L0)t\} \end{aligned} \quad (9)$$

where $\alpha = ERX \cdot EL0/2$, and $\beta = EUD \cdot EL0/2$.

Also, these signals SIFI and SIFQ are supplied to a low-pass filter 22 having a broader band than a band width (for example, in the range of 6 to 8 MHz) occupied by a video intermediate wave signal and an audio intermediate wave signal. As a result, signal components (and the local oscillation signals SL0I and SL0Q) of sums of angular frequencies (ωRX+ωL0) and (ωUD+ωL0) are removed from the signals SIFI and SIFQ. Thus, the signals SIFI and SIFQ expressed by Expressions (10) and (11) are fetched from the low-pass filter 22:

$$\begin{aligned} SIFI &= \alpha \cdot \cos(\omega RX - \omega L0) + \beta \cdot \cos(\omega UD - \omega L0)t \\ &= \alpha \cdot \cos\omega IFt + \beta \cdot \cos\omega IFt \end{aligned} \quad (10)$$

-continued $$SIFQ = \alpha \cdot \sin(\omega RX - \omega L0) + \beta \cdot \sin(\omega UD - \omega L0)t \quad (11)$$
$$= -\alpha \cdot \sin\omega IFt + \beta \cdot \sin\omega IFt$$

Also, these signals SIFI and SIFQ are supplied to a complex band-pass filter (polyphase band-pass filter) 24 through an amplitude phase correcting circuit 23 which will be described later. This complex band-pass filter 24 has the following characteristics:

(a) having frequency characteristics of a band-pass filter,
(b) giving a phase difference of 90° between the signal SIFI and the signal SIFQ, and
(c) having two band-pass characteristics having a frequency f0 and a frequency −f0, as central frequencies, symmetric with respect to a zero frequency on a frequency axis, and can select one or both of the two band-pass characteristics based on a relative phase of an input signal.

Therefore, with the complex band-pass filter 24, the signal SIFQ lags the signal SIFI by a phase difference of 90° in accordance with the items (b) and (c) described above. As a result, Expression (12) is transformed into Expression (13):

$$SIFI = \alpha \cdot \cos\omega IFt + \beta \cdot \cos\omega IFt \quad (12)$$

$$SIFQ = -\alpha \cdot \sin(\omega IFt - 90°) + \beta \cdot \sin(\omega IFt - 90°) \quad (13)$$
$$= \alpha \cdot \cos\omega IFt - \beta \cdot \cos\omega IFt$$

That is to say, signal components, α·cos ωIFt, of the signal SIFI and the signal SIFQ are in phase with each other, and signal components, β·cos ωIFt, of the signal SIFI and the signal SIFQ are 180° out-of-phase.

Also, the signal SIFI and the signal SIFQ are supplied to an amplifier 25 for level correction to be added to each other, and a signal SIF expressed by Expression (14) is fetched from the amplifier 25 for level correction:

$$SIF = SIFI + SIFQ \quad (14)$$
$$= 2\alpha \cdot \cos\omega IFt$$
$$= ERX \cdot EL0 \cdot \cos\omega IFt$$

The signal SIF thus fetched is nothing else but an intermediate frequency signal when the signal SRX is received by using the upper heterodyne system. Also, the intermediate frequency signal SIF contains therein no image disturbing signal SUD. It is noted that the amplitude phase correcting circuit 23 is provided in order to correct amplitudes and phases of the signals SIFI and SIFQ so that Expression (14) is sufficiently established, that is, the image disturbing signal SUD becomes minimum.

Moreover, at this time, even when levels of the signals SIFI and SIFQ are different from each other due to a difference in broadcasting system, the amplifier 25 for level correction corrects the level of the signal SIF so that AGC (Automatic Gain Control) characteristics (especially, a start level of the AGC) or the like which will be described later do not change.

Also, the intermediate frequency signal SIF is outputted to the terminal pin T12 through a variable gain amplifier 26 for AGC, and a band-pass filter 27 for cutting and aliasing a D.C. component.

Therefore, the changing of the frequency-dividing ratios M and N makes it possible to select the desired frequency (channel) in accordance with Expression (3). Also, the intermediate frequency signal SIF outputted to the terminal pin T12 is demodulated so as to correspond to the broadcasting system, which results in that the desired broadcasting can be viewed and listened.

Thus, according to the front end circuit 10, it is possible to respond to the broad frequency range of 46 to 887 MHz stated in the items (A) to (C) with one chip IC. In addition, the front end circuit 10 can be realized with the less number of parts or components without reducing the disturbing characteristics for the broad frequency range. Moreover, it is possible to cope with the difference in broadcasting system between the digital broadcasting and the analog broadcasting, and the difference in broadcasting system between the global areas with one front end circuit 10.

In addition, the reception disturbance due to the harmonic or the like of the clock signal is reduced, and as a result, the reception sensitivity is enhanced. Moreover, the entire PLL circuit 30 can be configured in the form of an on-chip in an IC except for capacitors C11, C12 and C13 in the loop filter 35. As a result, it is possible to obtain the PLL circuit which has the large resistance against the disturbance, and for which the hindrance occurrence is reduced. In addition, since the tuning circuits 14A to 14C are merely connected to the frequency amplifiers 13A to 13C, respectively, the load can be lightened and the distortions caused in the frequency amplifiers 13A to 13C can be reduced.

[1-1-1] Example of AGC

In a base-band processing circuit (details thereof will be described later) shown in FIG. 2, an AGC voltage VAGC is formed, and is then supplied as a control signal for a gain of a variable gain amplifier 26 for AGC to the variable gain amplifier 26 for AGC through the terminal pin T14. As a result, the AGC in the intermediate frequency stage is carried out.

In addition, for example, when the level of the desired received signal SRX is too large, or when the disturbing wave signal having a large level is mixedly contained in the received signal SRX, the AGC in the intermediate frequency stage described above can hardly cope with such a situation. In order to cope with this situation, the signals SIFI and SIFQ outputted from the low-pass filter 22 are supplied to a level detecting circuit 41. The level detecting circuit 41 detects whether or not each of the levels of the signals SIFI and SIFQ before the AGC is carried out in the variable gain amplifier 26 for AGC exceeds a predetermined value.

Also, a detection signal from the level detecting circuit 41, and the AGC voltage VAGC at the terminal pin T14 are supplied to an addition circuit 42, and an addition output signal from the addition circuit 42 is supplied to a formation circuit 43, thereby forming a delay AGC voltage VDAGC. The delay AGC voltage VDAGC is then supplied as a control signal for each of gains of high frequency amplifiers 13A to 13C to each of the high frequency amplifiers 13A to 13C, thereby carrying out the delay AGC.

Therefore, the optimal AGC operation can be carried out based on a D/U (Desire to Undesire ratio) between an intensity of a signal desired to be received and each of intensities of many signals undesired to be received. As a result, the desired broadcasting of the digital broadcasting and the analog broadcasting can, even when the digital broadcasting and the analog broadcasting are mixedly broadcasted, be received well.

[1-1-2] Example of Voltage for Test Adjustment

The signals SIFI and SIFQ outputted from the low-pass filter 22 are supplied to a linear detection circuit 44 to be detected and smoothed, thereby obtaining a D.C. voltage V44 representing each of the levels of the signals SIFI and SIFQ. Also, the resulting D.C. voltage V44 is outputted to the terminal pin T13.

The D.C. voltage V44 outputted to the terminal pin T13 is used in a phase of a test or adjustment of the front end circuit 10. For example, the D.C. voltage V44 can be used when the level of the input signal (received signal) is checked over the broad frequency range. That is to say, unlike the output signal obtained through an intermediate frequency filter having a narrow band, the attenuation characteristics of the broad band can be directly checked about a signal line extending from the antenna terminal pin T11 to each of the mixer circuits 21I and 21Q.

In addition, in the case where the antenna tuning circuits 12A to 12C, and the interstage tuning circuits 14A to 14c are adjusted, when an input test signal is supplied to the antenna terminal pin T11 and the AGC voltage VAGC supplied to the terminal pin T14 is fixedly set at a predetermined value, the tracking adjustment can be carried out based on a change in D.C. voltage V44. Moreover, data used to adjust the functions of the front end circuit 10, and to measure the characteristics thereof can be stored in a non-volatile memory 51 through the terminal pin T16, and thus can be supplied to the corresponding circuits when necessary.

[1-1-3] Initialization

The central frequency and a passband width of the complex band-pass filter 24, a correction amount in the amplitude phase correcting circuit 23, and a gain of the amplifier 25 for level correction are made variable and can be set from the outside because they needs to correspond to the broadcasting system of the received television broadcasting. For example, the central frequency of the complex band-pass filter 24 is made variable in the range of 3.8 to 5.5 MHz, and the passband thereof is made variable in the range of 5.7 to 8.0 MHz.

Also, in a phase of assembly, factory shipment or the like, set values for the amplitude phase correcting circuit 23, the complex band-pass filter 24, and the amplifier 25 for level correction are written to the non-volatile memory 51 through the terminal pin T16. In addition, data for tracking for the antenna tuning circuits 12A to 12C, and the interstage tuning circuits 14A to 14C (data used to fine-tune a tuning frequency), and data used to fine-tune the output voltage from the constant voltage circuit 53 are also written to the non-volatile memory 51 through the terminal pin T16 similarly to the case of the set values. Therefore, the characteristics of the individual circuits can be set so as to correspond to the broadcasting system of the television broadcasting desired to be received.

Note that, when the signals SL0I and SL0Q which are supplied from the frequency-dividing circuit 38 to the mixer circuits 21I and 21Q, respectively, are reversed from the above case, Expression (14) is transformed into Expression (15):

$$SIF = SIFI + SIFQ \qquad (15)$$
$$= -2\beta \cdot \cos\omega IFt$$
$$= EUD \cdot EL0 \cdot \cos\omega IFt$$

As a result, the image disturbing signal SUD is fetched through the terminal pin T13. Therefore, the amplitude phase correcting circuit 23 is adjusted so that the image disturbing signal SUD at this time becomes minimum, and the adjustment data is written to the non-volatile memory 51.

[1-1-4] Operation in Phase of Use

In the case as well where a power source of a receiver using the IC 10 is turned ON, the set values stored in the non-volatile memory 51 are copied to the buffer memory 52. Also, the set values thus copied are supplied as default values to the antenna tuning circuits 12A to 12C, the interstage tuning circuits 14A to 14C, the amplitude phase correcting circuit 23, the complex band-pass filter 24, the amplifier 25 for level correction, and the circuit 53, respectively.

Also, when a user selects a desired channel, data for the channel selection is supplied from a microcomputer (not shown) for system control to the buffer memory 52 through the terminal pin T17 to be temporarily stored therein. The data thus stored is supplied to each of the switch circuits 11 and 15, the antenna tuning circuits 12A to 12C, the interstage tuning circuits 14A to 14C, and the PLL circuit 30. As a result, the reception band containing the desired channel (frequency) is selected, and the desired channel is selected in the reception band.

[1-1-5] Conclusion

According to the front end circuit 10 shown in FIG. 1, it is possible to receive the television broadcasting in the frequency band of 46 to 887 MHz as shown in the items (A) to (C) described above. Also, at this time, since the central frequency and the passband width of the complex band-pass filter 24 are made variable, it is possible to respond to not only the domestic terrestrial digital broadcasting and terrestrial analog television broadcasting, but also the foreign digital broadcasting and analog television broadcasting.

[1-2] Example of Base-band Processing Circuit

Figure 2:
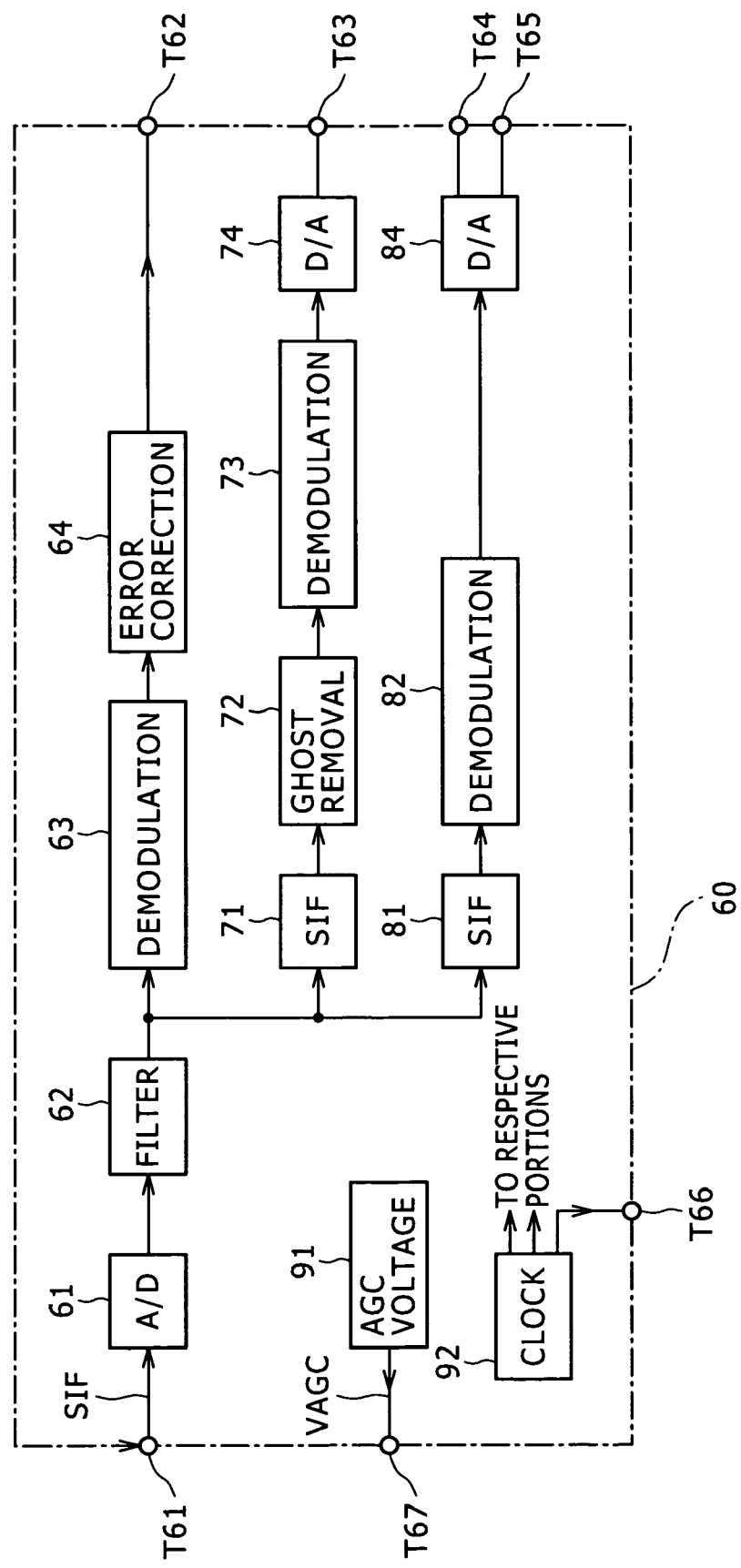
FIG. 2 is a block diagram showing an example of a baseband processing circuit.

FIG. 2 shows an example of a base-band processing circuit. The base-band processing circuit processes the intermediate frequency signal SIF outputted thereto from the front end circuit 10, and outputs a color video signal and an audio signal. That is to say, in FIG. 2, a portion 60 surrounded by a chain line shows the base-band processing circuit which is configured in the form of an one chip IC. In addition, this IC (base-band processing circuit) 60 has terminal pins T61 to T67 for external connection.

Also, the intermediate frequency signal SIF outputted through the terminal pin T12 of the front end circuit 10 is supplied to an A/D (Analog to Digital) converter circuit 61 to be A/D-converted into a digital intermediate frequency signal SIF. The resulting digital intermediate frequency signal SIF is then supplied to a filter 62, thereby removing therefrom unnecessary frequency components.

Also, at the time of reception of the digital television broadcasting, the digital intermediate frequency signal SIF outputted from the filter 62 is supplied to a demodulation circuit 63, so that the digital signal in the base-band is demodulated and fetched. The resulting demodulated output signal is supplied to an error correcting circuit 64 to become a data stream for which the error correction is carried out. The resulting data stream is outputted to the terminal pin T62. Therefore, when the signal at the terminal pin T62 is decoded in accordance with the broadcasting system corresponding thereto, it is possible to obtain the original color video signal and audio signal.

On the other hand, at the time of reception of the analog television broadcasting, the digital intermediate frequency signal SIF outputted from the filter 62 is supplied to a video intermediate frequency filter 71, thereby fetching therefrom a digital video intermediate frequency signal. After a ghost component is removed from the digital video intermediate frequency signal in a ghost removing circuit 72, the resulting signal is supplied to a modulation circuit 73 to be demodulated into a digital color video signal. Also, the resulting digital color video signal is supplied to a D/A (Digital to Analog) converter circuit 74 to be D/A-converted into an analog color video signal. The resulting analog color video signal is outputted to the terminal pin T63.

Moreover, at the time of reception of the analog television broadcasting, the digital intermediate frequency signal SIF outputted from the filter 62 is supplied to an audio intermediate frequency filter 81, thereby fetching therefrom a digital audio intermediate frequency signal. The digital audio intermediate frequency signal thus fetched is supplied to a demodulation circuit 82 to be demodulated into a digital audio signal. Also, the resulting digital audio signal is supplied to a D/A converter circuit 84 to be D/A-converted into audio signals of left- and right-hand channels. These audio signals of the left- and right-hand channels are outputted to the terminal pins T64 and T65, respectively.

In addition, an AGC voltage VAGC is formed in an AGC voltage forming circuit 91. The AGC voltage VAGC thus formed is outputted to the terminal pin T67, and is then applied to the terminal pin T14 of the front end circuit 10. As a result, the AGC in the intermediate frequency stage, and the delay AGC in the high frequency stage are carried out in the manner as described above.

Moreover, a clock signal having a predetermined frequency is formed in a clock forming circuit 92. The clock signal thus formed is supplied to each of the corresponding portions of the base-band processing circuit 60. Also, the clock signal is supplied to the signal forming circuit 36 through the terminal pin T66, and the terminal pin T15 of the front end circuit 10.

Therefore, the reception disturbance due to the harmonic or the like of the clock signal is reduced. As a result, the reception sensitivity is enhanced.

[2] With Respect to VCO 31 Capable of Being Used in the Present Invention

[2-1] With respect to Temperature Characteristics of Oscillation Frequency fVCO and Control Sensitivity KVCO of VCO 31

FIG. 4A shows an example of results of measurement of the characteristics of the control voltage VC and the oscillation frequency fVCO of the VCO 31. Also, FIG. 4B shows an example of results of measurement of the characteristics of the control voltage VC and the control sensitivity KVCO (=ΔfVCO/ΔVC) of the VCO 31. It is noted that in these figures, a heavy line indicates the characteristics when the ambient temperature T is 25° C., and a thin line indicates the characteristics when the ambient temperature T is 90° C. In this case, the ambient temperature T is used as a parameter.

Also, when the oscillation frequency fVCO is locked at 3,200 MHz in the case of T=25° C. in FIG. 4A, the control voltage VC≈1.06 V is obtained. Also, when the ambient temperature T rises to 90° C., the control voltage VC changes to about 1.15 V. However, according to the measurement results shown in FIG. 4B, even when there is a change in ambient temperature T, the control sensitivity KVCO does not change so much. Even in the vicinity of a local maximum value, when the control voltage VC is 1.06 V, the control sensitivity KVCO is about 206 MHz/V. When the control voltage VC is 1.15 V, the control sensitivity KVCO is about 220 MHz/V.

That is to say, when the control sensitivity KVCO for the ambient temperature T is corrected, even if the VCO which has the same correction characteristics of the control sensitivity KVCO irrespective of the ambient temperature T is substituted for the VCO 31, there is no problem in practical use because the correction error is sufficiently small. Therefore, the characteristics of the control sensitivity KVCO, for example, at T=25° C. are acquired and held. In this case, all that is required is that when the ambient temperature T changes, the control sensitivity KVCO is corrected from the control sensitivity KVCO thus held.

However, according to the measurement results shown in FIG. 4B, the control sensitivity KVCO largely changes depending on the control voltage VC. Thus, when the control voltage VC is in the range of 1.0 to 1.5 V, the control sensitivity KVCO becomes local maximum. Therefore, the control sensitivity KVCO, for example, when the control voltage VC is in the range of 1.0 to 1.5 V is supposed, and the charge pump current ICP is set from the control sensitivity KVCO. In this case, when the control voltage VC is out of the range of 1.0 to 1.5 V, the control sensitivity KVCO is low, and the loop gain decreases. As a result, it is impossible to obtain the desired characteristics.

From the foregoing, in the case where there is a change in ambient temperature T, when the control voltage VC is measured and converted into the control sensitivity KVCO, the charge pump current ICP is calculated from the control sensitivity KVCO, and the resetting is carried out, the loop characteristics can be held constant.

In other words, a data table, of the control sensitivity KVCO, having the control voltage VC as a variable, that is, a data table about the characteristics complementary to the characteristics shown in FIG. 4B is prepared. Also, by referring to the data table, the charge pump current ICP has to be corrected so as to correspond to the change in ambient temperature T. By adopting this process, even when the operation of the PLL circuit 30 is not stopped, the control sensitivity KVCO for the ambient temperature T can be corrected by correcting the charge pump current ICP.

At this time, the broadcasting can be continuously received because there is no need for stopping the operation of the PLL circuit 30. In addition, when the PLL circuit 30 is provided with no function of detecting the change in ambient temperature T, the control voltage VC has to be periodically measured, thereby calculating and setting the charge pump current ICP.

It is noted that even when a MOS type variable capacitance diode is used in the VCO 31 instead of using the variable capacitance diode (the so-called varicap), the oscillation frequency fVCO changes similarly. As a result, it is possible to obtain the same correction method as that in the above case.

[2-2] Consideration about that Temperature Change in Control Sensitivity KVCO is Small In this paragraph, let us consider that as shown in FIG. 4B, the temperature change of the control sensitivity KVCO is small. As well known, the oscillation frequency fVCO in an LC type oscillation circuit is given by Expression (16):

$$fVCO=1/(2\pi\sqrt{LC}) \quad (16)$$

where L is an inductance of a resonance circuit, and C is an electrostatic capacitance of the resonance circuit.

Figure 13:
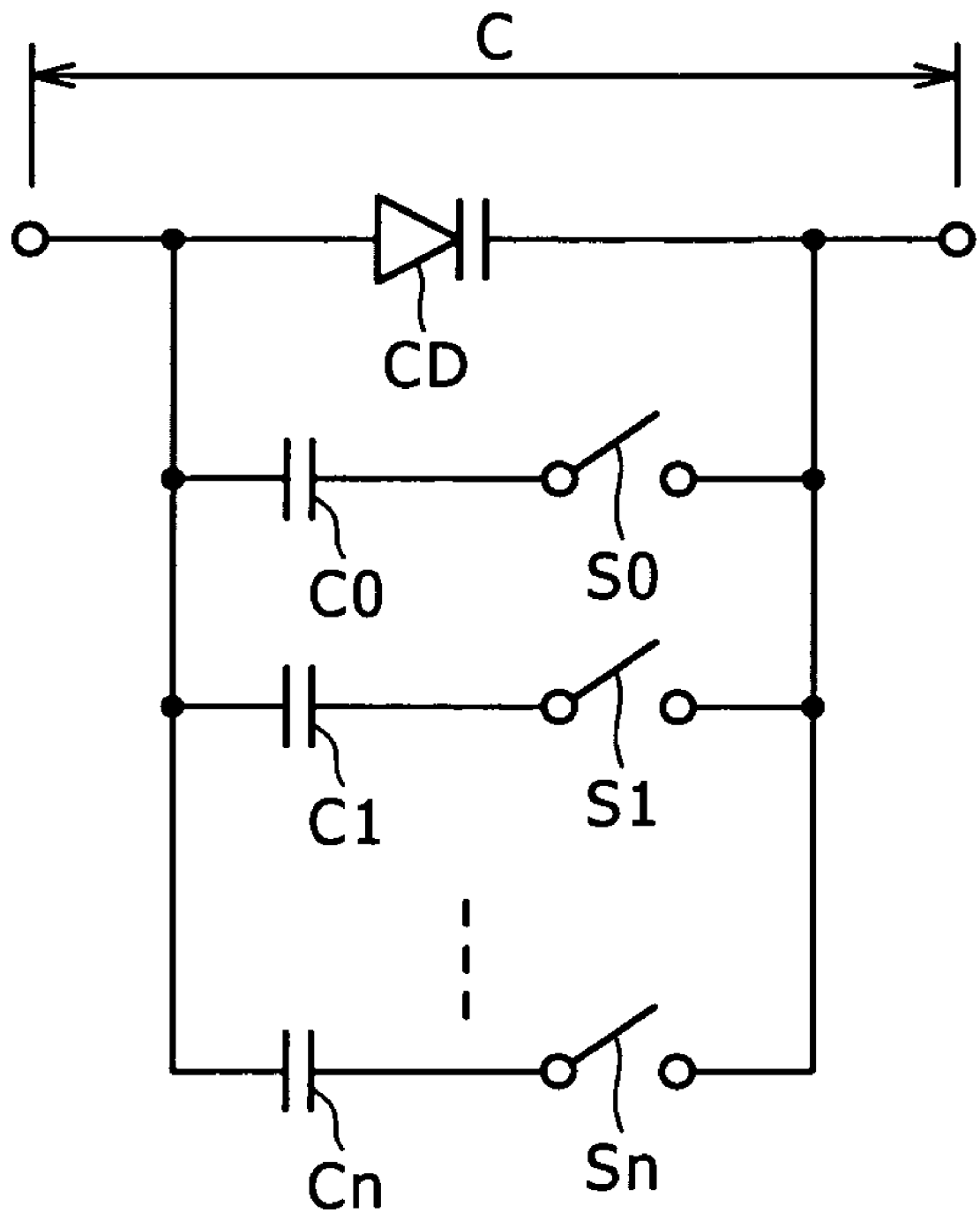
FIG. 13 is a circuit diagram showing an existing capacitor bank.

Therefore, when the VCO 31 is composed of an LC type oscillation circuit having a broad band, an electrostatic capacitance for the resonance becomes the total capacitance C in FIG. 13.

Also, it is thought that the temperature dependency of the oscillation frequency fVCO is mainly caused by a change in electrostatic capacitance C. Moreover, the electrostatic capacitance C includes the capacitance of the variable capacitance diode CD and the capacitances of the capacitors C0 to Cn (refer to FIG. 13), and a parasitic capacitance of a wiring or the like. In this case, it is thought that the temperature change in electrostatic capacitance C is mainly caused by changes in parasitic capacitances (having a PN junction capacitance) of the variable capacitance diode CD and the capacitors C0 to Cn.

However, each of the parasitic capacitances of the variable capacitance diode CD and the capacitors C0 to Cn essentially has no sensitivity for the control voltage VC. Therefore, the characteristics of the control sensitivity KVCO, as shown in FIG. 4B, do not change so much depending on the ambient temperature T.

Although the description has been given so far with respect to the LC type oscillation circuit, the description concerned also applies to a ring oscillator. Therefore, the VCO 31 is by no means limited to the LC type oscillation circuit.

[2-3] Example of Configuration of VCO 31

Figure 5:
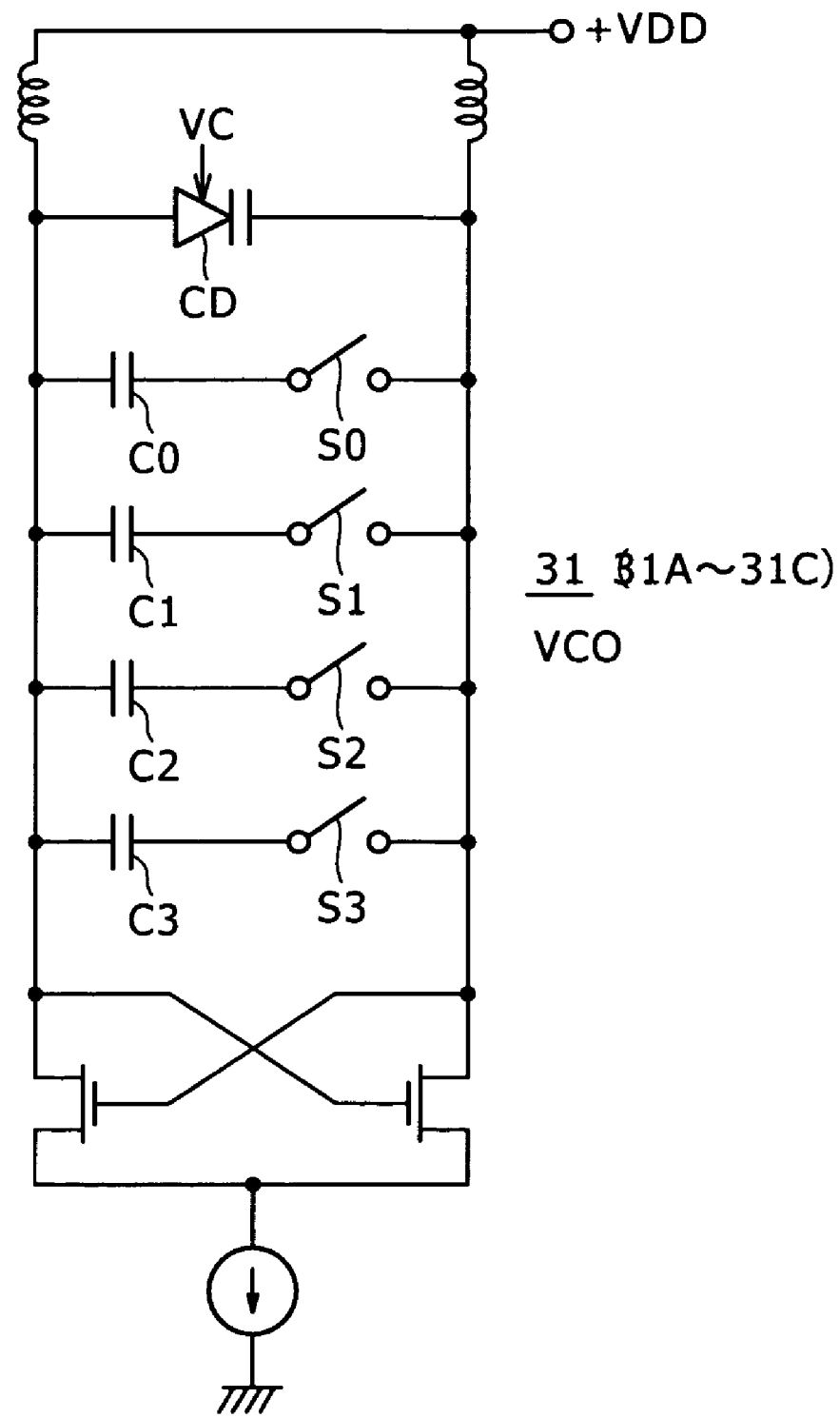
FIG. 5 is a circuit diagram explaining a part of the front end circuit shown in FIG. 1.

In consideration of the foregoing, the VCO 31 (VCOs 31A to 31C), for example, is configured in the form of an LC type resonance circuit as shown in FIG. 5. A resonance capacitance C of this LC type resonance circuit is configured by connecting a variable capacitance diode CD, and four (n=3 in the case shown in FIG. 13) series circuits of a capacitor C0 and a switch circuit S0, ..., a capacitor C1 and a switch circuit S1, a capacitor C2 and a switch circuit S2, and a capacitor C3 and a switch circuit S3 in parallel with one another. It is noted that capacitances of the four capacitors C0 to C3 are set in such a way that C0=reference value, C1=2·C0, C2=4·C0, and C3=8·C0.

Therefore, the resonance capacitance C changes from a minimum value to a maximum value in 16 steps as expressed by Expression (17) with the capacitance C0 as a change unit based on combinations of ON and OFF of the switch circuits S0 to S3:

$C = CD$ (minimum value)

$C = CD + C0$ $C = CD + 2 \cdot C0$

...

$C = CD + 15 \cdot C0$ (maximum value)  (17)

In addition, in the individual steps, the capacitance CD of the variable capacitance diode CD can be controlled with the control voltage VC.

As a result, in each of the VCOs 31A to 31C, the necessary oscillation frequency fVCO can be obtained based on the combinations of ON and OFF of the switch circuits S0 to S3, and the change in control voltage VC.

Figure 6:
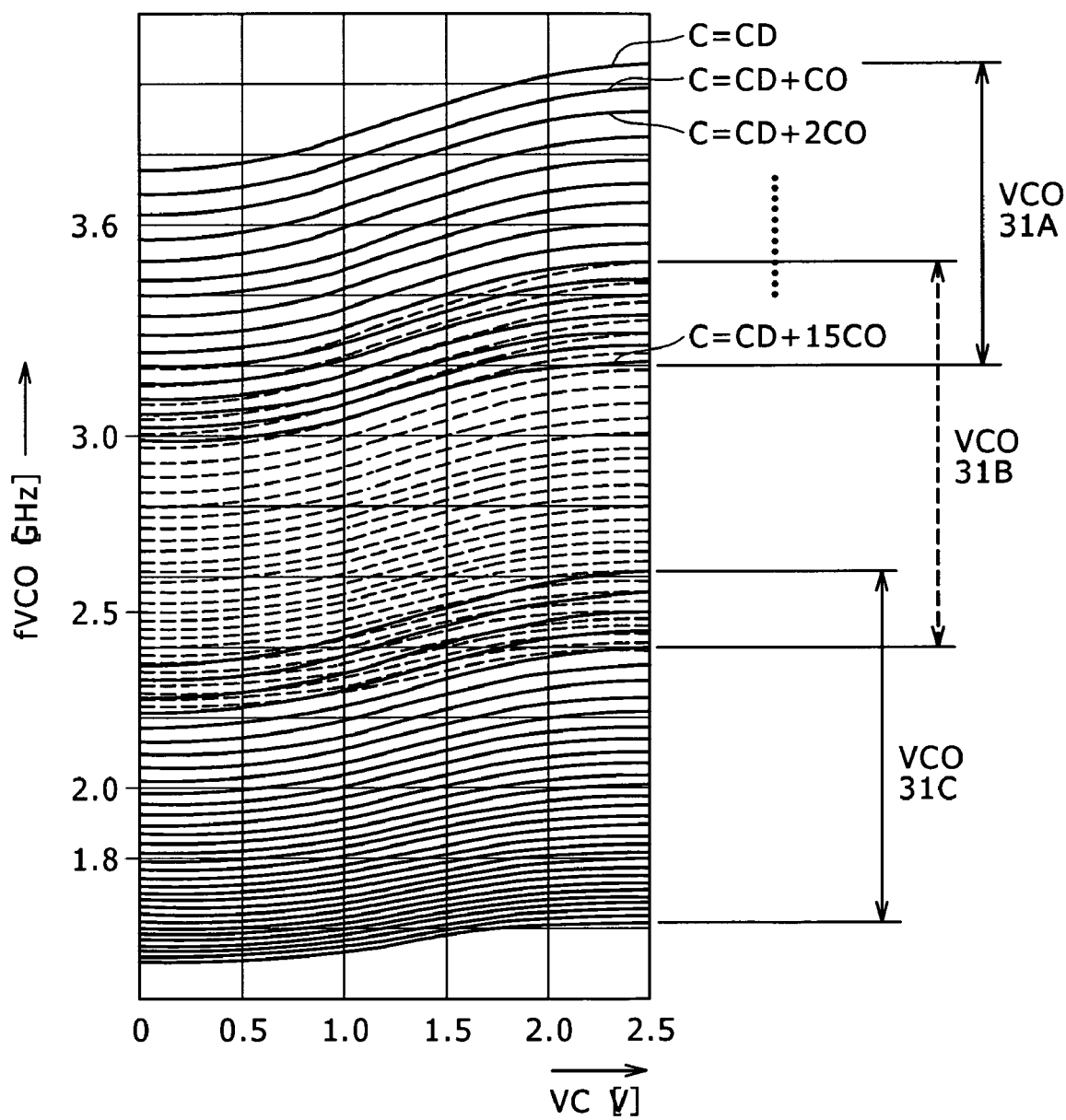
FIG. 6 is a graph explaining the part of the front end circuit shown in FIG. 1.

FIG. 6 shows an example of measurement of a relationship between the control voltage VC and the oscillation frequency VCO. In this case, a combination of connection of the capacitors C0 to C3 (a combination of ON and OFF of the switch circuits S0 to S3) is used as a parameter. In addition, in this case, upper 16 curves (each indicated by a solid line) represent the characteristics of the VCO 31A, middle 16 curves (each indicated by a broken line) represent the characteristics of the VCO 31B, and lower 16 curves (each indicated by a solid line) represent the characteristics of the VCO 31C.

As apparent from FIG. 6 as well, it is understood that the oscillation frequency fVCO (in the range of 1,800 to 3,000 MHz) necessary for the VCO 31 can be obtained based on the switching of the VCOs 31A to 31C, the combination of the capacitors C0 to C3, and the control for the capacitance of the variable capacitance diode CD.

In addition, it is also understood that the oscillation frequency fVCO for the control voltage VC has the same tendency as that of the characteristics shown in FIG. 4A. That is to say, although a gradient of each of the characteristic curves shown in FIG. 6 represents the control sensitivity KVCO, in any of the characteristic curves, the control sensitivity KVCO becomes local maximum at a center of the control voltage VC.

[3-1] First Embodiment of PLL Circuit 30

Figure 7:
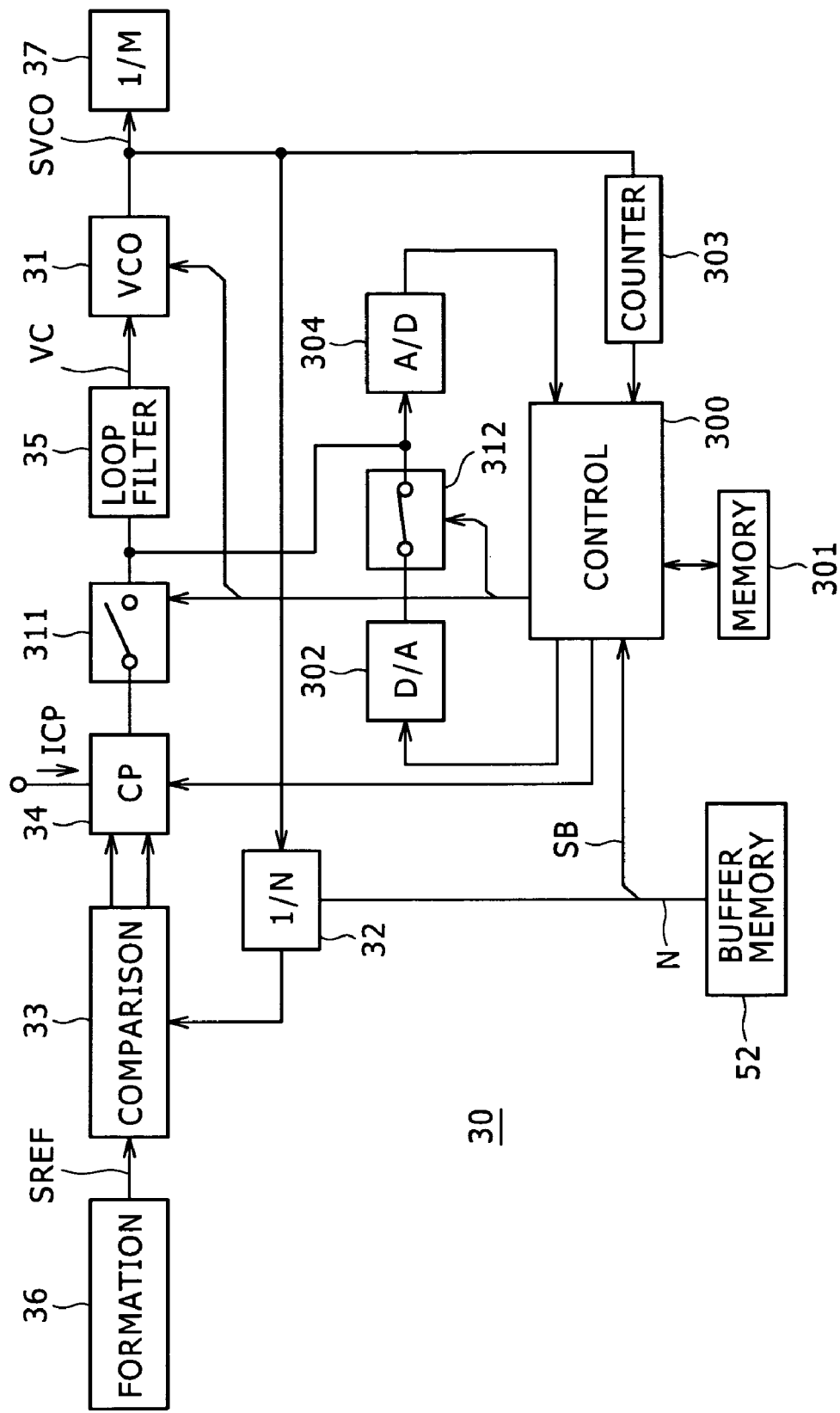
FIG. 7 is a block diagram showing a PLL circuit according to an embodiment of the present invention.

FIG. 7 shows a configuration of a PLL circuit 30 according to a first embodiment of the present invention. The PLL circuit 30 of the first embodiment is configured based on the paragraphs [2-1] to [2-3] described above. In this case, the VCO 31 is composed of the VCOs 31A to 31C (n=3 in the case of FIG. 13).

Also, data on the frequency driving ratio N is supplied from a buffer memory 52 to a variable frequency-dividing circuit 32, and the frequency driving ratio N is then set in the variable frequency-dividing circuit 32. In addition, a control circuit 300 is provided in the PLL circuit 30. A band signal SB used to set the reception bands of the items (A) to (C) described above, and the data on the frequency driving ratio N are supplied from the buffer memory 52 to the control circuit 300. Also, a control signal in accordance with which one of the VCOs 31A to 31C is switched over to another one so as to correspond to the reception bands of the items (A) to (C) described above is supplied from the control circuit 300 to the VCO 31.

In addition, a control signal in accordance with which the control sensitivity KVCO is controlled is supplied from the control circuit 300 to a charge pump circuit 34, so that a charge pump current ICP is controlled in the manner as will be described later. In addition, a memory 301 for storing therein the data on the characteristics of the control sensitivity KVCO, for example, shown in FIG. 4B is connected to the control circuit 300.

Note that, in FIG. 7, reference numeral 302 designates a D/A converter circuit, reference numeral 303 designates a frequency counter for detecting (counting) the oscillation frequency fVCO of the VCO 31, and reference numeral 304 designates an A/D converter circuit. In addition, the control circuit 300 controls switch circuits 311 and 312.

With this configuration, for example, when a power source of a receiver is turned ON, the control sensitivity of the VCO 31 is measured. That is to say, the control circuit 300 turns OFF the switch circuit 311, and turns ON the switch circuit 312. In addition, the control circuit 300, for example, selects the VCO 31A in the VCO 31.

Next, predetermined control data is supplied from the control circuit 300 to a D/A converter 302, and a D/A conversion output signal is supplied from the D/A converter 302 to a loop filter 35. Also, the loop filter 35 outputs a control voltage VC. The control voltage VC is outputted in order to obtain the control sensitivity characteristics shown in FIG. 4B, and changes from the lowest voltage up to the highest voltage.

That is to say, in the case of the control sensitivity characteristics shown in FIG. 4B, the control voltage VC changes from 0 V up to 2.5 V as shown in an axis of abscissa of FIG. 4B.

Also, since the oscillation frequency fVCO of the VCO 31 changes with the change in control voltage VC, the oscillation frequency fVCO is measured by the frequency counter 303, and data on the oscillation frequency fVCO thus measured is supplied to the control circuit 300.

As a result, the characteristics (for example, the characteristics shown in FIG. 4A) representing the relationship between the control voltage VC, and the oscillation frequency fVCO of the VCO 31 can be obtained based on the operation of the control circuit 300. In this case, the characteristics (for example, the characteristics shown in FIG. 4B) representing the relationship between the control voltage VC and the control sensitivity KVCO are calculated from the characteristics representing the relationship between the control voltage VC, and the oscillation frequency fVCO of the VCO 31. Also, the data on the characteristics concerned is stored in the memory 301.

Specifically, an i-th (i=1 to max.) control voltage VC(i) is supplied as the control voltage VC to the VCO 31, and an oscillation frequency fVCO(i) of the VCO 31 in the i-th control voltage VC(i) is measured. Next, an (i+1)-th control voltage VC(i+1) is supplied as the control voltage VC to the VCO 31, and an oscillation frequency fVCO(i+1) of the VCO 31 in the (i+1)-th control voltage VC(i+1) is measured.

In this case, Expression (18) is given as follows:

$$\Delta VC = VC(i+1) - VC(i)(VC(i+1) > VC(i)) \quad (18)$$

After this, the measurement is repetitively carried out similarly to the above case, and a difference KVCO(i) expressed by Expression (19) is obtained every measurement:

$$KVCO(i) = fVCO(i) - fVCO(i+1) \quad (19)$$

By adopting this process, the difference KVCO(i) can be obtained as the control sensitivity KVCO in the control voltage VC(i).

Therefore, when a set of control voltage VC(i) and control sensitivity KVCO(i) is stored as a data table in the memory 301, with respect to the VCO 31, the control sensitivity KVCO for an arbitrary control voltage VC can be known. It is noted that when there is no control voltage corresponding to the data table in this case, the control sensitivity KVCO can be obtained by carrying out the interpolation for the control sensitivities KVCO(i) and KVCO(i+1) of the nearest two points.

Also, the above processing is carried out with respect to the VCO for formation of the local oscillation frequency used in the actual receiving location (place of destination). It is noted that when there is caused the necessity for forming the local oscillation frequency to be used by another VCO from the reason that, for example, the receiving location is changed, the same processing is carried out again with respect to the another VCO.

Therefore, data on the characteristics representing the relationship between the control voltage VC and the control sensitivity KVCO is obtained with respect to the VCO, necessary for reception of the broadcasting, of the VCOs 31A to 31C, and is then stored in the memory 301.

Also, after completion of the measurement of the control sensitivity KVCO, the switch circuit 311 is turned ON and the switch 312 is turned OFF. As a result, the configuration of the normal PLL circuit 30 is obtained and thus the PLL operation starts to be carried out. Also, when the PLL circuit 30 is locked, the magnitude of the control voltage VC at this time is measured and is then converted into the control sensitivity KVCO by referring to the data table described above created in the memory 301 by the A/D converter circuit 304.

Also, the charge pump current ICP is controlled so that Expression (12) is established based on the control sensitivity KVCO as the results of the A/D conversion, and the frequency-dividing ratio N corresponding to the oscillation frequency fVCO at this time:

$$ICP \cdot KVCO/N = \kappa \quad (20)$$

where $\kappa$ is a predetermined constant value.

The predetermined constant value $\kappa$ is a constant value with which the band width of the loop of the PLL circuit 30 is determined, and is determined in the phase of design of the loop of the PLL circuit 30 or based on the previous evaluation. However, the predetermined constant value $\kappa$ is held as a default value in the non-volatile memory 51 (refer to FIG. 1), and thus can be changed as may be necessary.

Therefore, since the transfer function G(s) of the PLL circuit 30 becomes constant irrespective of the frequency-dividing ratio N, the loop characteristics of the PLL circuit 30 are stabilized irrespective of the oscillation frequency fVCO of the VCO 31, in other words, the received frequency.

Moreover, when the ambient temperature T changes in the phase of reception, the oscillation frequency fVCO of the VCO 31 changes accordingly. At this time, however, as apparent from the characteristic curve at T=25° C. or at T=90° C., for example, shown in FIG. 4A, the control voltage VC of the VCO 31 changes so as to cancel the frequency change in the characteristic curve. Hereupon, as a result, for example, as shown in FIG. 4B, the control sensitivity KVCO changes, so that the loop characteristics of the PLL circuit 30 become unstable.

However, in the PLL circuit 30 of the first embodiment shown in FIG. 7, the control circuit 300 fetches the data, corresponding to the control voltage VC at this time, of the data (for example, refer to FIG. 4B), representing the control sensitivity KVCO, stored in the memory 301. The data thus fetched is supplied as the control signal for the charge pump current ICP to the charge pump circuit 34. As a result, the magnitude of the charge pump current ICP is controlled in accordance with Expression (20) so that the transfer function G(s) of the open loop expressed in Expression (2) becomes constant irrespective of the control sensitivity KVCO.

Therefore, the loop characteristics of the PLL circuit 30 become stable irrespective of the ambient temperature T because the transfer function G(s) of the PLL circuit 30 becomes constant irrespective of the ambient temperature T.

As a result, according to the PLL circuit 30 of the first embodiment shown in FIG. 7, even when the oscillation frequency fVCO of the VCO 31 is changed in order to change the received frequency, that is, even when the frequency-dividing ration N of the variable frequency-dividing circuit 32 changes, or even when the control voltage VC of the VCO 31 changes, the charge pump current ICP changes in accordance with Expression (20). As a result, the transfer function G(s) when the PLL circuit 30 is held in the open loop state is kept constant. Therefore, the stability of the PLL circuit 30 does not change at all.

In addition, when the ambient temperature T changes, the oscillation frequency fVCO of the VCO 31 changes accordingly. However, the control sensitivity KVCO changes so as to correspond to the control voltage VC of the VCO 31 at this time, and the charge pump current ICP changes in accordance with Expression (20) so as to correspond to the change in control sensitivity KVCO. As a result, the stability of the PLL circuit 30 does not change at all.

Figure 8:
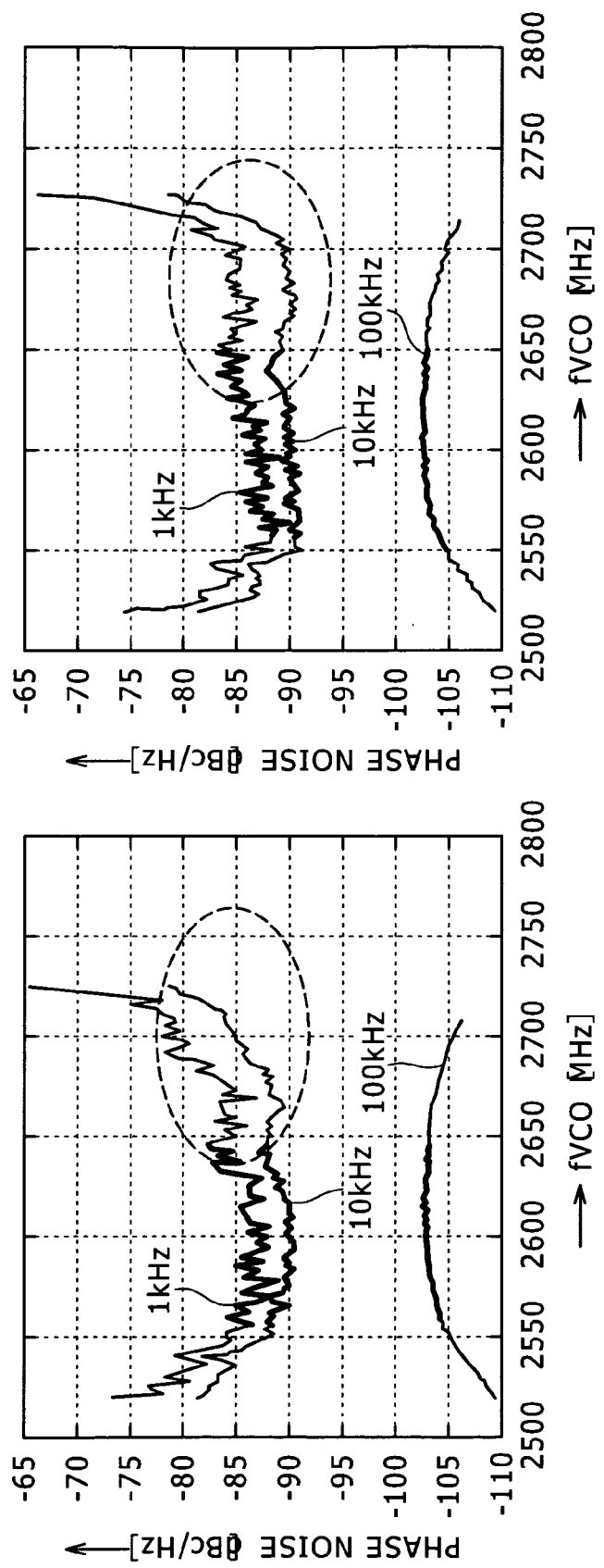
FIGS. 8A and 8B are respectively graphs showing examples of measurement of characteristics of the PLL circuit shown in FIG. 7.

FIGS. 8A and 8B show the results of measurement of the distribution characteristics of the phase noise of the PLL circuit 30 of the first embodiment shown in FIG. 7. That is to say, FIG. 8A shows the results of measurement of the distribution characteristics of the phase noise of the PLL circuit 30 when the charge pump current ICP is changed based only on the oscillation frequency fVCO of the VCO 31. Also, FIG. 8B shows the results of measurement of the distribution characteristics of the phase noise of the PLL circuit 30 when the charge pump current ICP is changed in consideration of the control sensitivity KVCO as well of the VCO 31 according to the embodiment the present invention.

According to FIGS. 8A and 8B, it is understood that the reduction of the phase noise in a high frequency range (a portion surrounded by a broken line) is larger in the case where the charge pump current ICP is changed in consideration of the control sensitivity KVCO of the VCO 31 (FIG. 8B) than in the case where the charge pump current ICP is changed without consideration of the control sensitivity KVCO of the VCO 31 (FIG. 8A). That is to say, the measurement results mean that the phase noise characteristics are improved. Therefore, these frequency ranges can also be used.

[3-2] Second Embodiment of PLL Circuit 30

Figure 9:
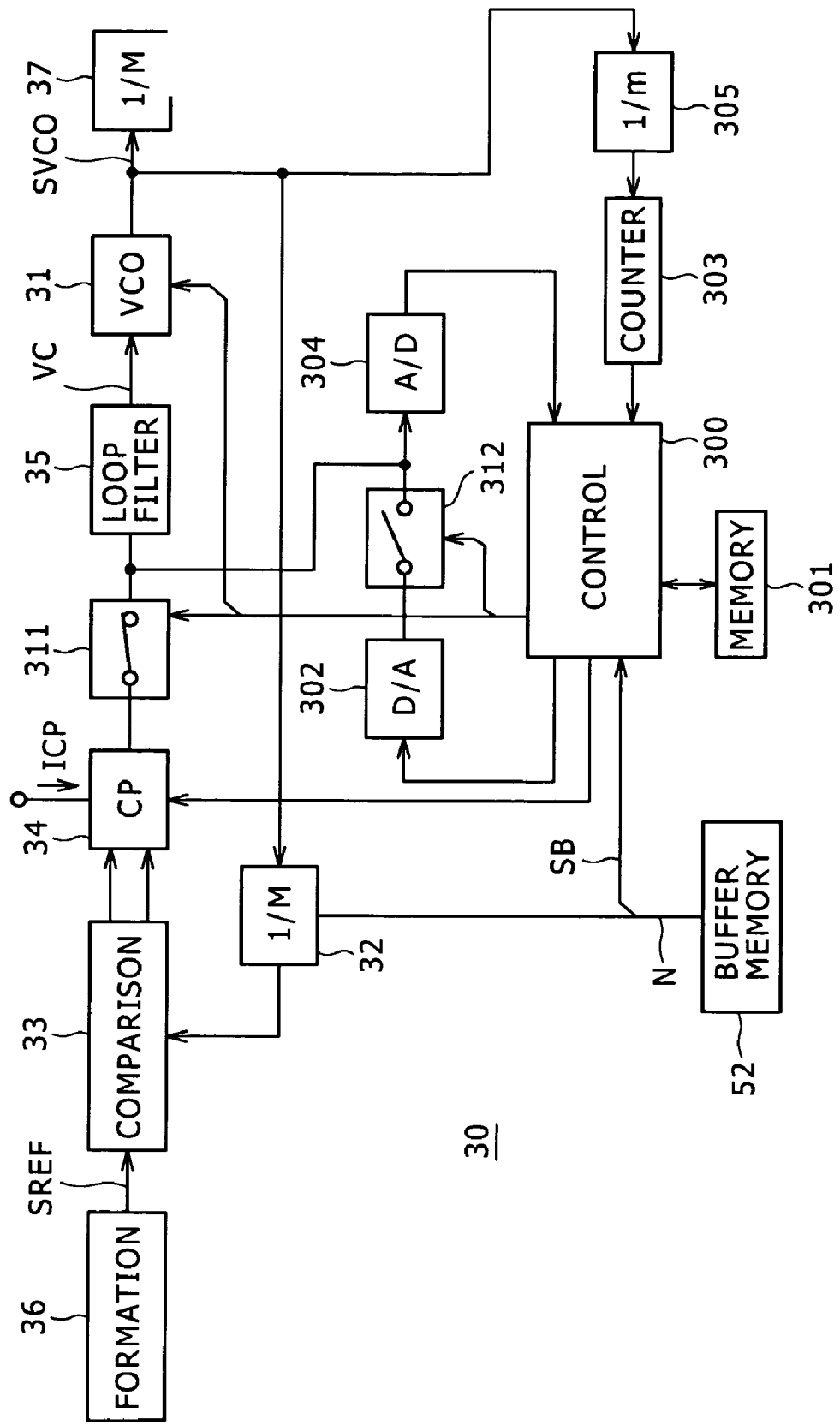
FIG. 9 is a block diagram showing a PLL circuit according to another embodiment of the present invention.

In a second embodiment shown in FIG. 9, a PLL circuit 30 is configured basically, similarly to the case of the PLL circuit 30 of the first embodiment shown in FIG. 7. Also, an oscillation signal SVCO, having an oscillation frequency, of a VCO 31 is supplied to a frequency-dividing circuit 305 to be frequency-divided into a frequency-dividing signal having a frequency of 1/m (m: positive integral number) of the oscillation frequency. Also, the resulting frequency-dividing signal is supplied as a count input to a frequency counter 303. In addition, although not illustrated in the figure, start and stop of a counting operation of the frequency counter 303 are controlled in accordance with a frequency-dividing signal. In this case, a pulse having a frequency of 1 MHz is frequency-divided into this frequency-dividing signal having a frequency of 1/m of 1 MHz. That is to say, the frequency counter 303 counts the number of cycles of the oscillation signal SVCO of the VCO 31 for one cycle time period of the pulse having the frequency of 1 MHz.

Therefore, in this case, a count value of the counter 303 becomes a frequency at which the oscillation frequency fVCO of the VCO 31 is counted with MHz as a unit. As a result, it is unnecessary to provide processing or a circuit for converting the count value of the frequency counter 303 into a frequency. In addition, it is also unnecessary to use a high-speed frequency counter as the frequency counter 303.

[3-3] Third Embodiment of PLL Circuit 30

Figure 10:
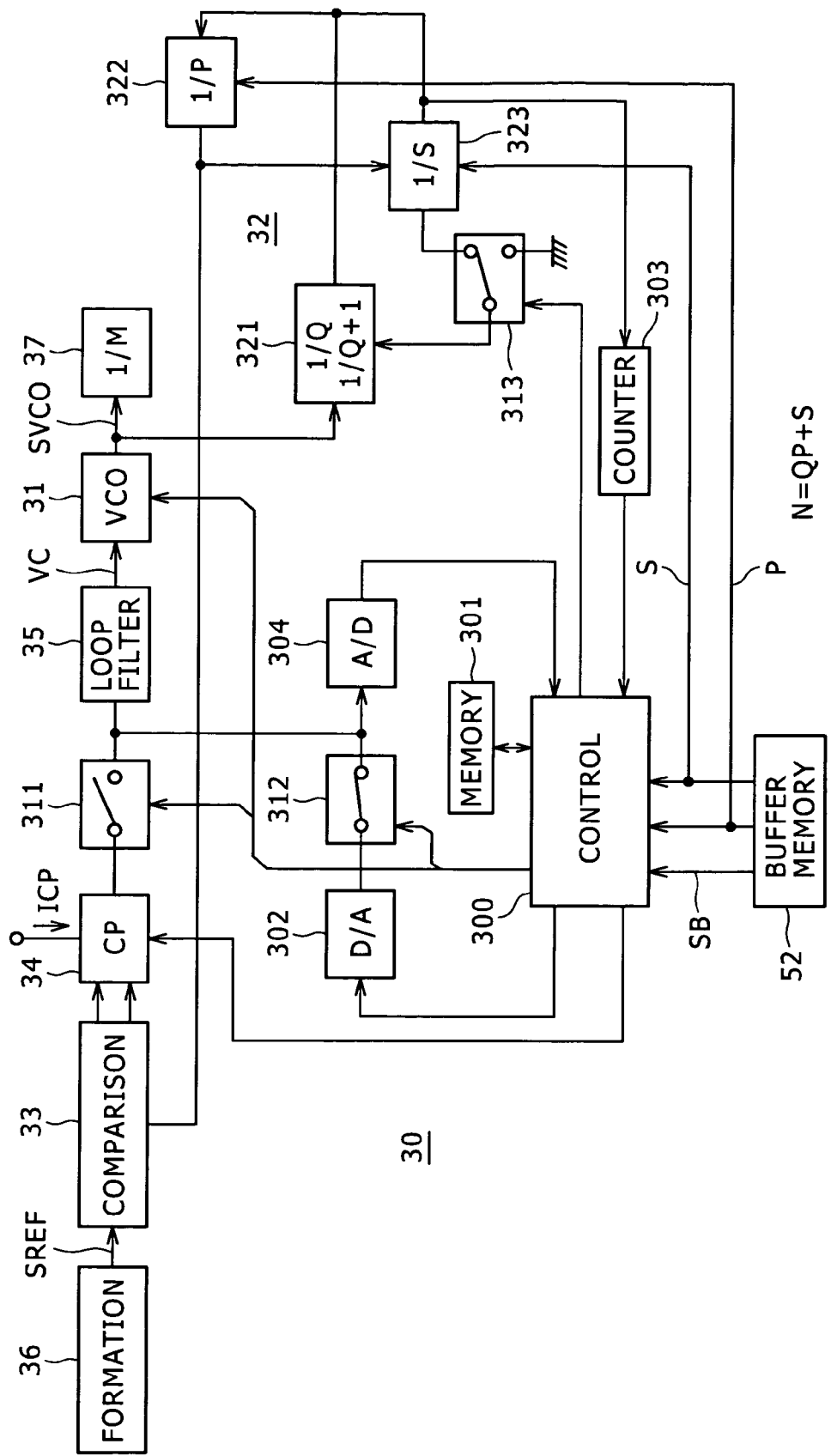
FIG. 10 is a block diagram showing a PLL circuit according to still another embodiment of the present invention.

In a PLL circuit 30 of a third embodiment shown in FIG. 10, a variable frequency-dividing circuit 32 of the PLL circuit 30 of the third embodiment is configured in the form of a multi-modulus type frequency-dividing circuit, for example, a pulse swallow type frequency-dividing circuit by using a dual modulus pre-scaler.

That is to say, an oscillation signal SVCO, having an oscillation frequency, of a VCO 31 is supplied to a pre-scaler 321 to be frequency-divided into a frequency-dividing signal having a frequency of 1/Q or 1/(1+Q) of the oscillation frequency. Also, the resulting frequency-dividing signal is supplied to each of a pulse counter 322 having a frequency-dividing ratio P, and a swallow counter 323 having a frequency-dividing ratio S. In this case, the frequency-dividing ratios P and Q are positive integral numbers, respectively, and a relationship of S<P is established between them.

Also, an output signal from the swallow counter 323 is supplied as a switching signal (modulus control signal) used to switch one of the frequency-dividing ratios Q and (1+Q) over to another one to the pre-scaler 321 through a switch circuit 313. When the output signal from the swallow counter 323 is "0," the frequency-dividing ratio is set at the value Q, while when the output signal from the swallow counter 323 is "1," the frequency-dividing ratio is set at the value (1+Q).

In addition, an output signal from the pulse counter 322 is supplied as a comparison input signal to a phase comparison circuit 33, and is also supplied as a reset signal to the swallow counter 323. Moreover, the control circuit 300 controls the switch circuit 313 and a counter 303.

With such a configuration, in a stationary phase, the output signal from the swallow counter 323 is supplied to the pre-scaler 321 through the switch circuit 313. In addition, the output signal from the swallow counter 323 is held at "1" for a time period for which the input signal is counted up to a value S previously set. On the other hand, the output signal from the swallow counter 323 becomes "0" when the input signal is counted up to the value S, and stops its counting operation. Also, the output signal from the swallow counter 323 is continuously held at "0" until the swallow counter 323 is reset by the output signal from the pulse counter 322. When being rest by the output signal from the pulse counter 322, the swallow counter 323 restarts the counting operation.

Also, when counting the input signal up to a value P previously set, the pulse counter 322 outputs the reset pulse described above, and resets itself. As a result, the pulse counter 322 starts to count the input signal again from the start.

In addition, the relationship of S<P is established, which results in that while the swallow counter 323 counts the input signal, the pulse counter 322 counts the frequency-dividing output signal having the frequency of 1/(1+Q) of the oscillation frequency from the pre-scaler 321, and while the swallow counter 323 stops to count the input signal, the pulse counter 322 counts the frequency-dividing output signal having the frequency of 1/Q of the oscillation frequency from the pre-scaler 321.

Also, since in the stationary phase, the reset pulse outputted from the pulse counter 322 becomes the frequency-dividing output (having the frequency of 1/N of the oscillation frequency) for the variable frequency-dividing circuit 32, a total frequency-dividing ratio N in the stationary phase is given by Expression (21):

$$N = (Q+1) \cdot S + Q \cdot (P-S) \qquad (21)$$
$$= QP + S$$

Therefore, suitably selecting the values P and Q makes it possible to change the frequency-dividing ratio N "1" at a time.

In the third embodiment shown in FIG. 10, the control signal, for the frequency-dividing ratio, supplied to the pre-scaler 321 is set at "0" by the switch circuit 313, and thus the frequency-dividing ratio of the pre-scaler 321 is set at the value Q. Therefore, during the frequency-counting, the frequency-dividing signal having the frequency of 1/Q of the oscillation frequency of the oscillation signal SVCO is outputted from the pre-scaler 321 irrespective of the operation of the pulse swallow counter 32. Also, the frequency-dividing signal is inputted to the pulse counter 322.

When the variable frequency-dividing circuit 32 is configured in the form of the pulse swallow type frequency-dividing circuit in the manner as described above, it is unnecessary to specially provide the frequency-dividing circuit having the frequency-dividing ratio Q for the frequency counting. Thus, the frequency-dividing ratio of the pre-scaler 321 is used as the fixed value Q in the phase of measurement of the frequency, which results in that the pre-scaler 321 can be used as the frequency-dividing circuit as well having the frequency-dividing ratio Q. Using the pre-scaler 321 as the frequency-dividing circuit as well having the frequency-dividing ratio Q offers an effect that the output load of the VCO 31 is prevented from being increased. As a result, it is possible to suppress the scale-up of the circuit scale. It is noted that if necessary, a fixed frequency-dividing circuit may be further additionally provided in a subsequent stage.

[4] Conclusion

According to the PLL circuits 30 of the first to third embodiments, even when the control sensitivity KVCO of the VCO 31 disperses due to the manufacture process of the IC 10, the desired PLL characteristics can be held, and at this time, the trimming or the like needs not to be carried out.

In addition, even when the ambient temperature T changes, the control voltage VC changes so that no oscillation frequency fVCO of the VCO 31 changes. As a result, even when the control sensitivity UVCO changes, the loop characteristics of the PLL circuit 30 can be controlled so as to be held at the defined value without stopping the operation of the PLL circuit 30.

Moreover, even when the measurement voltage or the like is not applied from the outside to the PLL circuit 30 operating in the stationary state, it is possible to measure the oscillation frequency fVCO, the control voltage VC and the control sensitivity KVCO of the VCO 31. Therefore, when a failure is caused in the PLL circuit 30, an analysis for the failure can be readily carried out.

[5] The Others

In the above case, in the case where the data table representing the relationship between the control voltage VC and the control sensitivity KVCO of the VCO 31 is created, when the resolutions or the signal levels (analog values) of the D/A converter circuit 302 and the A/D converter circuit 304 are equalized to each other, it is possible to simplify the creation of the data table described above. For example, the A/D converter circuit 304 can be configured in the form of a successive-approximation type A/D converter circuit for carrying out A/D conversion based on a reference voltage generated from the D/A converter circuit 302.

In addition, the measurement of the control sensitivity KVCO can be carried out whenever the combination of the capacitors C0 to C3 (in the case shown in FIG. 5) in the VCO 31 is changed. Moreover, the control circuit 300 can be realized in the form of software which is executed by a microcomputer or the like composing a system control circuit.

Moreover, in the phase of creation of the data table representing the relationship between the control voltage VC and the control sensitivity KVCO of the VCO 31, an output impedance of the charge pump circuit 34 can be made a high impedance instead of turning OFF the switch circuit 311.

The present application contains subject matter related to that disclosed in Japanese Priority Patent Application JP 2008-089371, filed in the Japan Patent Office on Mar. 31, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A phase locked loop circuit comprising:
a voltage controlled oscillator;
a variable frequency-dividing circuit for frequency-dividing an oscillation signal having an oscillation frequency of the voltage controlled oscillator into a frequency-dividing signal having a frequency of (1/N) (N: positive integral number) of the oscillation frequency of the oscillation signal;
a phase comparing circuit for comparing a phase of the frequency-dividing signal outputted from the variable frequency-dividing circuit, and a phase of a signal having a reference frequency with each other;
a charge pump circuit to which a comparison output signal is supplied from the phase comparing circuit;
a loop filter for fetching a direct current component from an output signal from the charge pump circuit, and supplying the direct current component thus fetched as a control signal for the oscillation frequency of the voltage controlled oscillator to the voltage controlled oscillator;
a voltage supplying circuit for, in a phase of measurement, supplying a predetermined first control voltage as a control signal for the oscillation frequency of the voltage controlled oscillator to the voltage controlled oscillator instead of the output signal from the charge pump circuit;
a frequency measuring circuit for, in the phase of the measurement, measuring the oscillation frequency of the voltage controlled oscillator; and
a voltage measuring circuit for, in a phase of use, measuring a magnitude of a second control voltage supplied as a control signal for the oscillation frequency of the voltage controlled oscillator to the voltage controlled oscillator;
wherein in the phase of the measurement, a data table representing a relationship between the first control voltage, and a rate of a change in oscillation frequency of the voltage controlled oscillator is created by the voltage supplying circuit and the frequency measuring circuit;
in the phase of the use, the second control voltage measured by the voltage measuring circuit is converted into a control sensitivity representing the rate of the change in oscillation frequency by referring to the data table; and
a magnitude of a charge pump current of the charge pump circuit is controlled by using the control sensitivity as a result of the conversion so that a transfer function in a phase of an open loop becomes constant irrespective of the frequency-dividing ratio N,
wherein the voltage supplying circuit including:
a digital to analog converter circuit; and
a control circuit for supplying digital data which is digital to analog-converted into the first control voltage to the digital to analog converter; and
the voltage measuring circuit including an analog to digital converter circuit for analog to digital-converting the second control voltage, and supplying the resulting digital voltage to the control circuit.

2. The phase locked loop circuit according to claim 1, further comprising:
- a counter for frequency-dividing the oscillation signal having the oscillation frequency of the voltage controlled oscillator into a frequency-dividing signal having a frequency of 1/m (m: positive integral number) of the oscillation frequency, and supplying the resulting frequency-dividing signal as a measurement input signal to the frequency measuring circuit;
- wherein start and stop of an operation of the frequency measuring circuit is controlled in accordance with a frequency-dividing signal into which a pulse having a frequency of 1 MHz is frequency-divided, the frequency-dividing signal having a frequency of 1/m of 1 MHz.

3. The phase locked loop circuit according to claim 1, wherein the variable frequency-dividing circuit is configured in a form of a pulse swallow type frequency-dividing circuit.

4. The phase locked loop circuit according to claim 1, wherein a local oscillation signal for frequency conversion is formed from the oscillation signal of the voltage controlled oscillator.

5. An integrated circuit for a phase locked loop circuit comprising:
- a voltage controlled oscillator;
- a variable frequency-dividing circuit for frequency-dividing an oscillation signal having an oscillation frequency of the voltage controlled oscillator into a frequency-dividing signal having a frequency of (1/N) (N: positive integral number) of the oscillation frequency of the oscillation signal;
- a phase comparing circuit for comparing a phase of the frequency-dividing signal outputted from the variable frequency-dividing circuit, and a phase of a signal having a reference frequency with each other;
- a charge pump circuit to which a comparison output signal is supplied from the phase comparing circuit; and
- a loop filter for fetching a direct current component from an output signal from the charge pump circuit, and supplying the direct current component thus fetched as a control signal for the oscillation frequency of the voltage controlled oscillator to the voltage controlled oscillator;
- wherein a voltage supplying circuit for, in a phase of measurement, supplying a predetermined first control voltage as a control signal for the oscillation frequency of the voltage controlled oscillator to the voltage controlled oscillator instead of the output signal from the charge pump circuit, a frequency measuring circuit for, in the phase of the measurement, measuring the oscillation frequency of the voltage controlled oscillator, and a voltage measuring circuit for, in a phase of use, measuring a magnitude of a second control voltage supplied as a control signal for the oscillation frequency of the voltage controlled oscillator to the voltage controlled oscillator are formed as one-chip integrated circuit;
- in the phase of the measurement, a data table representing a relationship between the first control voltage, and a rate of a change in oscillation frequency of the voltage controlled oscillator is created by the voltage supplying circuit and the frequency measuring circuit;
- in the phase of the use, the second control voltage measured by the voltage measuring circuit is converted into a control sensitivity representing the rate of the change in oscillation frequency by referring to the data table; and
- a magnitude of a charge pump current of the charge pump circuit is controlled by using the control sensitivity as a result of the conversion so that a transfer function in a phase of an open loop becomes constant irrespective of the frequency-dividing ratio N,
- wherein the voltage supplying circuit including:
- a digital to analog converter circuit; and
- a control circuit for supplying digital data which is digital to analog-converted into the first control voltage to the digital to analog converter; and
- the voltage measuring circuit including an analog to digital converter circuit for analog to digital-converting the second control voltage, and supplying the resulting digital voltage to the control circuit.

* * * * *